US012581775B2

(12) United States Patent
Lazo Martinez et al.

(10) Patent No.: US 12,581,775 B2
(45) Date of Patent: Mar. 17, 2026

(54) DISPLAY DEVICE AND METHOD OF MANUFACTURING THE SAME

(71) Applicant: Samsung Display Co., LTD., Yongin-si (KR)

(72) Inventors: Israel Esteban Lazo Martinez, Yongin-si (KR); Suk Hoon Kang, Yongin-si (KR); Jeong Soo Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 660 days.

(21) Appl. No.: 17/942,414

(22) Filed: Sep. 12, 2022

(65) Prior Publication Data

US 2023/0261141 A1 Aug. 17, 2023

(30) Foreign Application Priority Data

Feb. 16, 2022 (KR) ........................ 10-2022-0020347

(51) Int. Cl.
| | |
|---|---|
| *H10H 20/831* | (2025.01) |
| *H01L 25/16* | (2023.01) |
| *H10H 20/01* | (2025.01) |

(52) U.S. Cl.
CPC ......... *H10H 20/831* (2025.01); *H01L 25/167* (2013.01); *H10H 20/032* (2025.01)

(58) Field of Classification Search
CPC ............... H10H 20/831; H10H 20/857; H10H 20/83–835; H10H 29/832–8325; H10H 20/032; H10H 29/032; H10H 20/819–821; H01L 25/167; H01L 25/0753; H05B 33/26–28; G09G 2300/0421–0434
See application file for complete search history.

(56) References Cited

U.S. PATENT DOCUMENTS

| | | | |
|---|---|---|---|
| 9,390,951 | B2 | 7/2016 | Freer et al. |
| 10,818,647 | B2 | 10/2020 | Kim et al. |
| 11,101,257 | B2 | 8/2021 | Kim et al. |
| 12,356,767 | B2 | 7/2025 | Jeong et al. |
| 12,382,768 | B2 | 8/2025 | Jeong et al. |
| 2021/0249392 | A1* | 8/2021 | Woo ...................... H01L 25/167 |
| 2021/0376281 | A1* | 12/2021 | Kim .................... H10K 50/822 |
| 2022/0044624 | A1* | 2/2022 | Chi ...................... H10H 20/857 |
| 2022/0406972 | A1 | 12/2022 | Im et al. |
| 2023/0209907 | A1* | 6/2023 | Jung ................... H10K 59/122 |
| | | | 257/79 |

FOREIGN PATENT DOCUMENTS

| | | |
|---|---|---|
| KR | 10-2018-0007025 | 1/2018 |
| KR | 10-2020-0022061 | 3/2020 |
| KR | 10-2021-0059088 A | 5/2021 |
| KR | 10-2021-0103602 A | 8/2021 |
| KR | 10-2022-0014472 A | 2/2022 |

* cited by examiner

*Primary Examiner* — Shahed Ahmed

(74) *Attorney, Agent, or Firm* — Womble Bond Dickinson (US) LLP

(57) ABSTRACT

A display device includes an alignment electrode disposed on a substrate and including a first electrode and a second electrode spaced apart from each other, a light emitting element disposed on the first electrode and the second electrode, and a sub-electrode disposed on the substrate, and including a first sub-electrode and a second sub-electrode spaced apart from each other. The sub-electrode may include a base part and a protrusion protruding from the base part in a plan view.

17 Claims, 26 Drawing Sheets

FIG. 8

DISPLAY DEVICE AND METHOD OF MANUFACTURING THE SAME

CROSS-REFERENCE TO RELATED APPLICATION(S)

This application claims priority to and benefits of Korean Patent Application No. 10-2022-0020347 under 35 U.S.C. § 119, filed on Feb. 16, 2022 in the Korean Intellectual Property Office, the entire contents of which are incorporated herein by reference.

BACKGROUND

1. Technical Field

The disclosure relates to a display device and a method of manufacturing the same.

2. Description of the Related Art

In recent years, as interest in information display is increasing, research and development for display devices are continuously being conducted.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Aspects of the disclosure provide a display device having improved luminance and an improved alignment degree of a light emitting element, and a method of manufacturing the display device.

According to an embodiment, a display device may include an alignment electrode disposed on a substrate and including a first electrode and a second electrode spaced apart from each other; a light emitting element disposed on the first electrode and the second electrode; and a sub-electrode disposed on the substrate, and including a first sub-electrode and a second sub-electrode spaced apart from each other, the sub-electrode may include a base part and a protrusion protruding from the base part in a plan view.

According to an embodiment the light emitting element may include a first semiconductor layer; a second semiconductor layer; and an active layer disposed between the first semiconductor layer and the second semiconductor layer, a protrusion of the first sub-electrode protrudes from the first semiconductor layer toward the second semiconductor layer, and a protrusion of the second sub-electrode protrudes from the second semiconductor layer toward the first semiconductor layer.

According to an embodiment, the display device may further include a lower sub-electrode disposed on the substrate; a transistor electrically connected to the light emitting element and including a first transistor electrode, a second transistor electrode, and a gate electrode; a protective layer disposed on the transistor; and a bridge pattern disposed on the protective layer, and the sub-electrode and one of the lower sub-electrode, the gate electrode, the first transistor electrode, the second transistor electrode, and the bridge pattern, may be disposed on a same layer.

According to an embodiment, the protrusion may have a triangular shape including a surface connected to the base part.

According to an embodiment, the protrusion may have a trapezoidal shape including a surface connected to the base part.

According to an embodiment, a portion of the protrusion may have a triangular shape including a surface connected to the base part, and another portion of the protrusion may have a trapezoidal shape including a surface connected to the base part.

According to an embodiment, a portion of the sub-electrode may not overlap the alignment electrode in a plan view.

According to an embodiment, the base part may overlap the alignment electrode in a plan view, and the protrusion may not overlap the alignment electrode in a plan view.

According to an embodiment, the first electrode and the first sub-electrode may overlap in a plan view, and the second electrode and the second sub-electrode may overlap in a plan view, and the light emitting element may be disposed in a path having a circular shape between the first electrode and the second electrode in a plan view.

According to an embodiment, a position of the protrusion of the first sub-electrode and a position of the protrusion of the second sub-electrode may correspond to each other and form a pair, and the light emitting element may correspond to the formed pair of protrusions.

According to an embodiment, the protrusion may be spaced apart from a side of the base part.

According to an embodiment, the display device may further a bank having a shape protruding in a thickness direction of the substrate; an emission area including the light emitting element and does not overlap the bank in a plan view; and a non-emission area not including the light emitting element, and in which the first electrode and the second electrode are spaced apart from each other in a first direction, the non-emission area may include an area that does not overlap the bank in a plan view, and the area that does not overlap the bank may be disposed between adjacent emission areas in a second direction different from the first direction.

According to an embodiment, the alignment electrode may have a first width in the emission area and a second width in the area that does not overlap the bank, and the first width may be greater than the second width.

According to an embodiment, the emission area may include a first emission area and a second emission area adjacent to each other in the first direction, and an electrode most adjacent to the second emission area among alignment electrodes in the first emission area and an electrode most adjacent to the first emission area among alignment electrodes in the second emission area provide a cathode signal.

According to an embodiment, the display device may further include a bank disposed on the substrate and protruding in a thickness direction of the substrate, and the light emitting element is disposed between banks, and the bank may include a reflective material.

According to an embodiment of the disclosure, a display device may include an alignment electrode disposed on a substrate; a light emitting element disposed in an emission area on the substrate; and a sub-electrode disposed on the substrate, and the sub-electrode may include a protrusion protruding toward the light emitting element, the emission area may include emission areas spaced apart from each other, and the protrusion may be disposed in each of the emission areas.

According to an embodiment of the disclosure, a method of manufacturing a display device may include disposing a sub-electrode on a substrate; disposing a protective layer on the sub-electrode and disposing an alignment electrode including a first electrode and a second electrode on the protective layer; providing an ink including a light emitting element and a solvent on the substrate, and aligning the light emitting element, and in the aligning of the light emitting element may include providing an electrical signal to the sub-electrode; and providing an electrical signal to the alignment electrode, and the sub-electrode may include a base part and a protrusion protruding from the base part.

According to an embodiment, the method may further include forming a bank protruding in a thickness direction of the substrate on the protective layer and defining a space accommodating a fluid, and the providing of the ink may include providing the ink to the space, and the bank may include a reflective material.

According to an embodiment, the aligning of the light emitting element may include aligning the light emitting element based on an electric field according to the electrical signal provided to the sub-electrode and the alignment electrode.

According to an embodiment, in the aligning of the light emitting element may include moving the light emitting element based on a first electric field according to the electrical signal provided to the sub-electrode; and rotating the light emitting element based on a second electric field according to the electrical signal provided to the alignment electrode.

According to an embodiment, the providing of the electrical signal, an intensity of an electric field formed in an area including the protrusion may be greater than an intensity of an electric field formed in an area not including the protrusion.

According to an embodiment, the display device may include an emission area including the light emitting element, the emission area may include a first emission area and a second emission area adjacent to the first emission area in a first direction, and providing the electrical signal to the sub-electrode and the alignment electrode may include providing a cathode signal to the second electrode and the second sub-electrode disposed in the first emission area; and providing a cathode signal to the second electrode and the second sub-electrode disposed in the second emission area.

According to an embodiment, the providing of the alignment electrode may include patterning the alignment electrode to overlap the base part without overlapping the protrusion in a plan view.

According to an embodiment, a display device may include a sub-electrode disposed on a substrate; a protective layer disposed on the sub-electrode and an alignment electrode including a first electrode and a second electrode disposed on the protective layer; a light emitting element disposed on the substrate; and the light emitting element may be aligned by providing an electrical signal to the sub-electrode; the alignment electrode may be provided with a signal, and; the sub-electrode may include a base part and a protrusion protruding from the base part.

According to an embodiment of the disclosure, a display device having improved luminance and an improved alignment degree of a light emitting element, and a method of manufacturing the display device may be provided.

BRIEF DESCRIPTION OF THE DRAWINGS

The above and other features of the disclosure will become more apparent by describing in further detail embodiments thereof with reference to the accompanying drawings, in which:

FIG. 8 is a schematic plan view schematically illustrating an emission area;

DETAILED DESCRIPTION OF THE EMBODIMENTS

Figure 1:
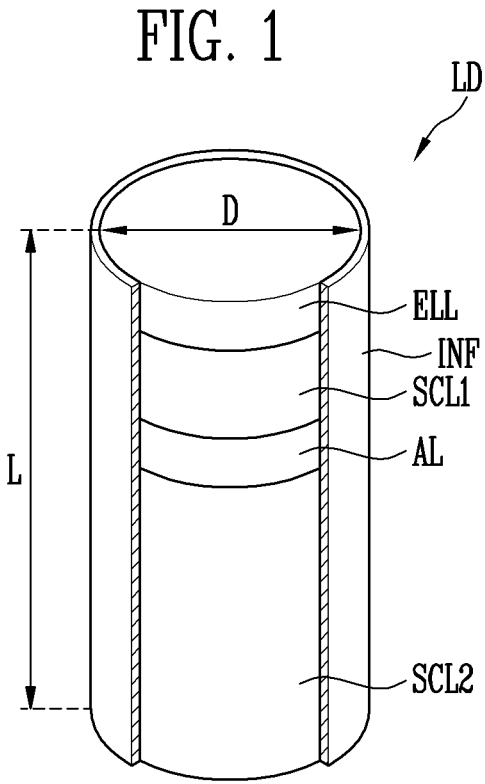
FIGS. 1 and 2 are schematic perspective and cross-sectional views illustrating a light emitting element according to an embodiment.

The disclosure may be modified in various manners and have various forms. Therefore, embodiments will be illustrated in the drawings and will be described in detail in the specification. However, it should be understood that the disclosure is not intended to be limited to the disclosed forms, and the disclosure includes all modifications, equivalents, and substitutions within the spirit and technical scope of the disclosure.

In the drawings, sizes, thicknesses, ratios, and dimensions of the elements may be exaggerated for ease of description and for clarity. Like numbers refer to like elements throughout.

Terms of "first", "second", and the like may be used to describe various components, but the components should not be limited by the terms. The terms are used only for the purpose of distinguishing one component from another component. For example, without departing from the scope of the disclosure, a first component may be referred to as a second component, and similarly, a second component may also be referred to as a first component.

In the following description, the singular expressions include plural expressions unless the context clearly dictates otherwise. For example, as used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It should be understood that the terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

A case where a portion of a layer, a layer, an area, a plate, or the like is referred to as being "on" another portion, it includes not only a case where the portion is "directly on" another portion, but also a case where there is further another portion between the portion and another portion. In the specification, when a portion of a layer, a layer, an area, a plate, or the like is formed on another portion, a forming direction is not limited to an upper direction but includes forming the portion on a side surface or in a lower direction. On the contrary, when a portion of a layer, a layer, an area, a plate, or the like is formed "under" or below another portion, this includes not only a case where the portion is "directly beneath" another portion but also a case where there is further another portion between the portion and another portion.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined or implied herein, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The disclosure relates to a display device and a method of manufacturing the same. Hereinafter, a display device and a method of manufacturing the same according to an embodiment are described with reference to the accompanying drawings.

First, a light emitting element LD according to an embodiment is described with reference to FIGS. 1 to 4.

Figure 2:
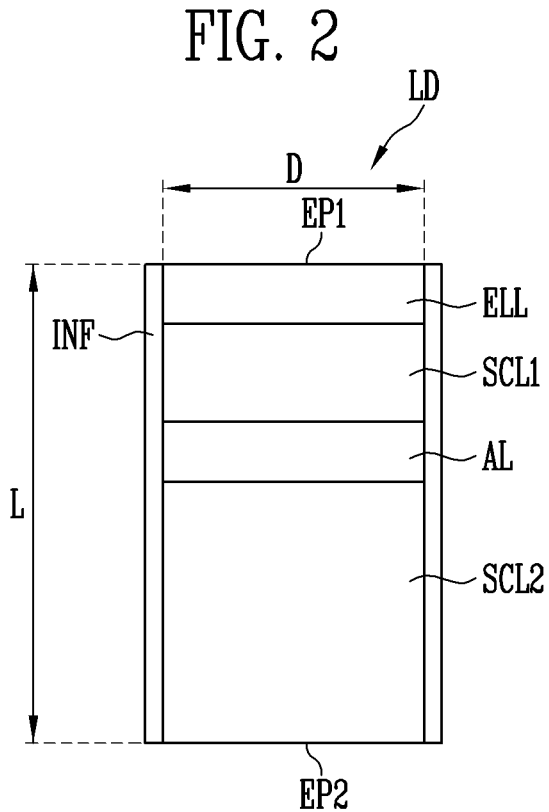
Figure 3:
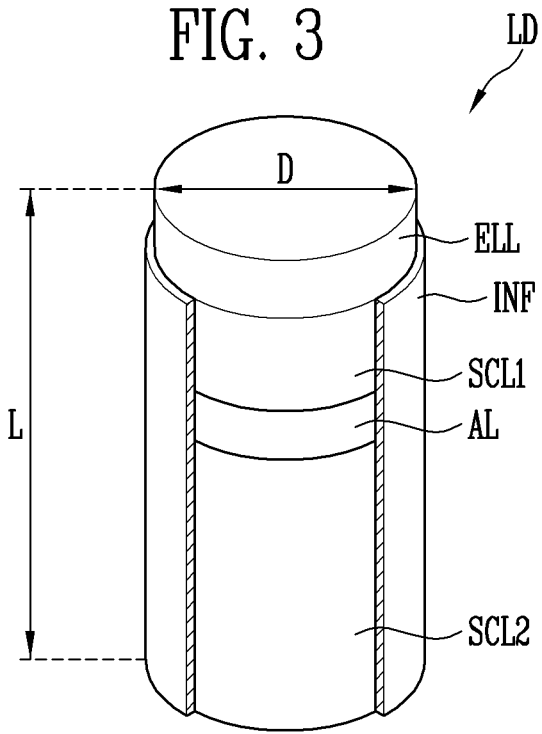
FIGS. 3 and 4 are schematic perspective and cross-sectional views illustrating a light emitting element according to an embodiment.
Figure 4:
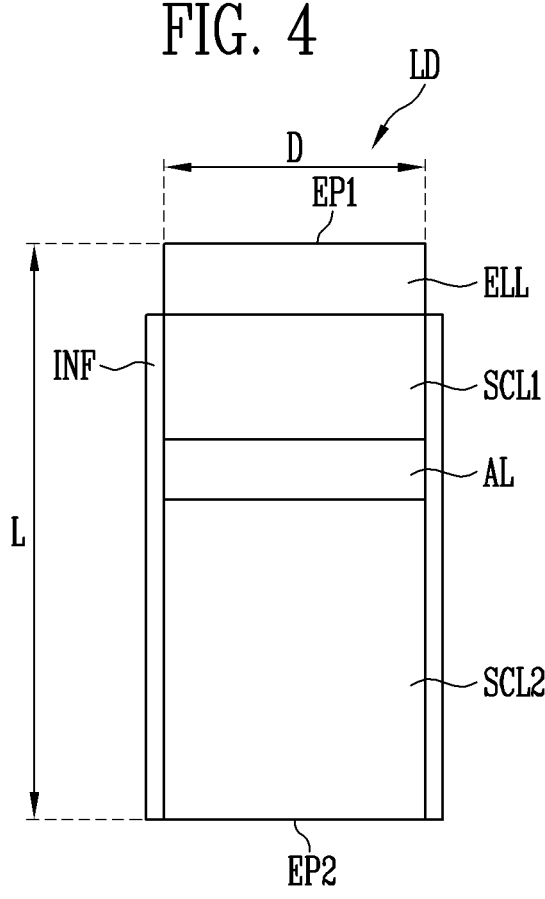

FIGS. 1 and 2 are schematic perspective and cross-sectional views illustrating a light emitting element according to an embodiment. FIGS. 3 and 4 are schematic perspective and cross-sectional views illustrating a light emitting element according to an embodiment.

Although a column shape light emitting element LD is shown in FIGS. 1 to 4, a type and/or a shape of the light emitting element LD are/is not limited thereto. It is to be understood that the shapes disclosed herein may also include shapes substantial to the shapes disclosed herein.

The light emitting element LD may include a second semiconductor layer SCL2, a first semiconductor layer SCL1, and an active layer AL interposed between the first and second semiconductor layers SCL1 and SCL2. For example, in case that an extension direction of the light emitting element LD is referred to as a length L direction, the light emitting element LD may include the first semiconductor layer SCL1, the active layer AL, and the second semiconductor layer SCL2 sequentially stacked each other along the length L direction. The light emitting element LD may further include an electrode layer ELL and an insulating layer INF.

The light emitting element LD may be provided in a column shape extending in one direction or direction. The light emitting element LD may have a first end EP1 and a second end EP2. The first semiconductor layer SCL1 may be adjacent to the first end EP1 of the light emitting element LD, and the second semiconductor layer SCL2 may be adjacent to the second end EP2 of the light emitting element LD. The electrode layer ELL may be adjacent to the first end EP1.

The light emitting element LD may be a light emitting element manufactured in a column shape through an etching method or the like within the spirit and the scope of the disclosure. In the specification, the column shape may include a rod-like shape or a bar-like shape that is long in the length L direction (for example, an aspect ratio is greater than 1) such as a circular column or a polygonal column, and a shape of a cross-section thereof is not particularly limited. For example, a length L of the light emitting element LD may be greater than a diameter D (or a width of a cross-section) thereof.

The light emitting element LD may have a size of a nano scale to a micro scale. For example, each of the light emitting elements LD may have a diameter D (or a width) and/or a length L of a range of a nano scale to a micro scale. However, the size of the light emitting element LD is not limited thereto.

The first semiconductor layer SCL1 may be a first conductive semiconductor layer. The first semiconductor layer SCL1 may be disposed on the active layer AL and may include a semiconductor layer of a type different from that of the second semiconductor layer SCL2. For example, the first semiconductor layer SCL1 may include a P-type semiconductor layer. For example, the first semiconductor layer SCL1 may include at least one semiconductor material of InAlGaN, GaN, AlGaN, InGaN, AlN, and InN, and may include a P-type semiconductor layer doped with a first conductive dopant such as Mg. However, the material forming the first semiconductor layer SCL1 is not limited thereto, and various other materials may form the first semiconductor layer SCL1.

The active layer AL may be disposed between the first semiconductor layer SCL1 and the second semiconductor layer SCL2 and may have a single-quantum well or multi-quantum well structure. A position of the active layer AL is not limited to a specific example, and may be variously changed according to a type of the light emitting element LD.

A clad layer doped with a conductive dopant may be formed on and/or under or below the active layer AL. For example, the clad layer may be formed of an AlGaN layer or an InAlGaN layer. According to an embodiment, a material of AlGaN, InAlGaN, or the like may be used to form the active layer AL, and various other materials may form the active layer AL.

The second semiconductor layer SCL2 may be a second conductive semiconductor layer. The second semiconductor layer SCL2 may be disposed on the active layer AL and may include a semiconductor layer of the type different from that of the first semiconductor layer SCL1. For example, the second semiconductor layer SCL2 may include an N-type semiconductor layer. For example, the second semiconductor layer SCL2 may include a semiconductor material of any one of InAlGaN, GaN, AlGaN, InGaN, AlN, and InN, and may include an N-type semiconductor layer doped with a second conductive dopant such as Si, Ge, or Sn. However, the material forming the second semiconductor layer SCL2 is not limited thereto, and various other materials may form the second semiconductor layer SCL2.

In case that a voltage greater than or equal to a threshold voltage is applied to the both ends of the light emitting element LD, the light emitting element LD emits light while an electron-hole pair is combined in the active layer AL. By controlling the light emission of the light emitting element LD using this principle, the light emitting element LD may be used as a light source of various light emitting devices including a pixel of a display device.

The insulating layer INF may be disposed on a surface of the light emitting element LD. The insulating layer INF may be formed on a surface of the light emitting element LD to surround at least an outer circumferential surface of the active layer AL, and may further surround one area or an area of the first and second semiconductor layers SCL1 and SCL2. The insulating layer INF may be formed of a single layer or double layers, but is not limited thereto, and may be formed of layers. For example, the insulating layer INF may include a first insulating layer including a first material and a second insulating layer including a second material different from the first material.

The insulating layer INF may expose the both ends of the light emitting element LD having different polarities. For example, the insulating layer INF may expose one end or an end of each of the electrode layer ELL and the second semiconductor layer SCL2 adjacent to the first and second ends EP1 and EP2 of the light emitting element LD.

The insulating layer INF may be a single layer or multiple layers by including at least one insulating material among silicon oxide ($SiO_x$), silicon nitride ($SiN_x$), silicon oxynitride ($SiO_xN_y$), aluminum oxide ($AlO_x$), and titanium oxide ($TiO_x$). However, the insulating layer INF is not necessarily limited to the above-described example. For example, according to an embodiment, the insulating layer INF may be omitted.

According to an embodiment, in case that the insulating layer INF is provided to cover the surface of the light emitting element LD, by way of example, the outer circumferential surface of the active layer AL, electrical stability of the light emitting element LD may be secured. In case that the insulating layer INF is provided on the surface of the light emitting element LD, a surface defect of the light emitting element LD may be minimized to improve lifespan and efficiency. Even in a case where light emitting elements LD are disposed close to each other, an unwanted short circuit may be prevented from occurring between the light emitting elements LD.

The electrode layer ELL may be disposed on the first semiconductor layer SCL1. The electrode layer ELL may be adjacent to the first end EP1. The electrode layer ELL may be electrically connected to the first semiconductor layer SCL1.

A portion of the electrode layer ELL may be exposed. For example, the insulating layer INF may expose one surface or a surface of the electrode layer ELL. The electrode layer ELL may be exposed in an area corresponding to the first end EP1.

According to an embodiment, a side surface of the electrode layer ELL may be exposed (refer to FIGS. 3 and 4). For example, the insulating layer INF may cover side surfaces of each of the first semiconductor layer SCL1, the active layer AL, and the second semiconductor layer SCL2, and may not cover at least a portion of the side surface of the electrode layer ELL. Electrical connection to another configuration of the electrode layer ELL adjacent to the first end EP1 may be readily connected. According to an embodiment, the insulating layer INF may expose a portion of the side surface of the first semiconductor layer SCL1 and/or the second semiconductor layer SCL2 as well as the side surface of the electrode layer ELL.

According to the embodiment, the electrode layer ELL may be an Ohmic contact electrode. However, the disclosure is not necessarily limited to the above-described example. For example, the electrode layer ELL may be a Schottky contact electrode.

According to an embodiment, the electrode layer ELL may include one of chromium (Cr), titanium (Ti), aluminum (Al), gold (Au), nickel (Ni), an oxide thereof, or an alloy thereof. However, the disclosure is not necessarily limited to the above-described example. According to an embodiment, the electrode layer ELL may be substantially transparent. For example, the electrode layer ELL may include indium tin oxide (ITO). Accordingly, emitted light may pass through the electrode layer ELL.

A structure, a shape, or the like of the light emitting element LD is not limited to the above-described example, and the light emitting element LD may have various structures and shapes according to an embodiment. For example, the light emitting element LD may further include an additional electrode layer disposed on one surface or a surface of the second semiconductor layer SCL2 and adjacent to the second end EP2.

Figure 5:
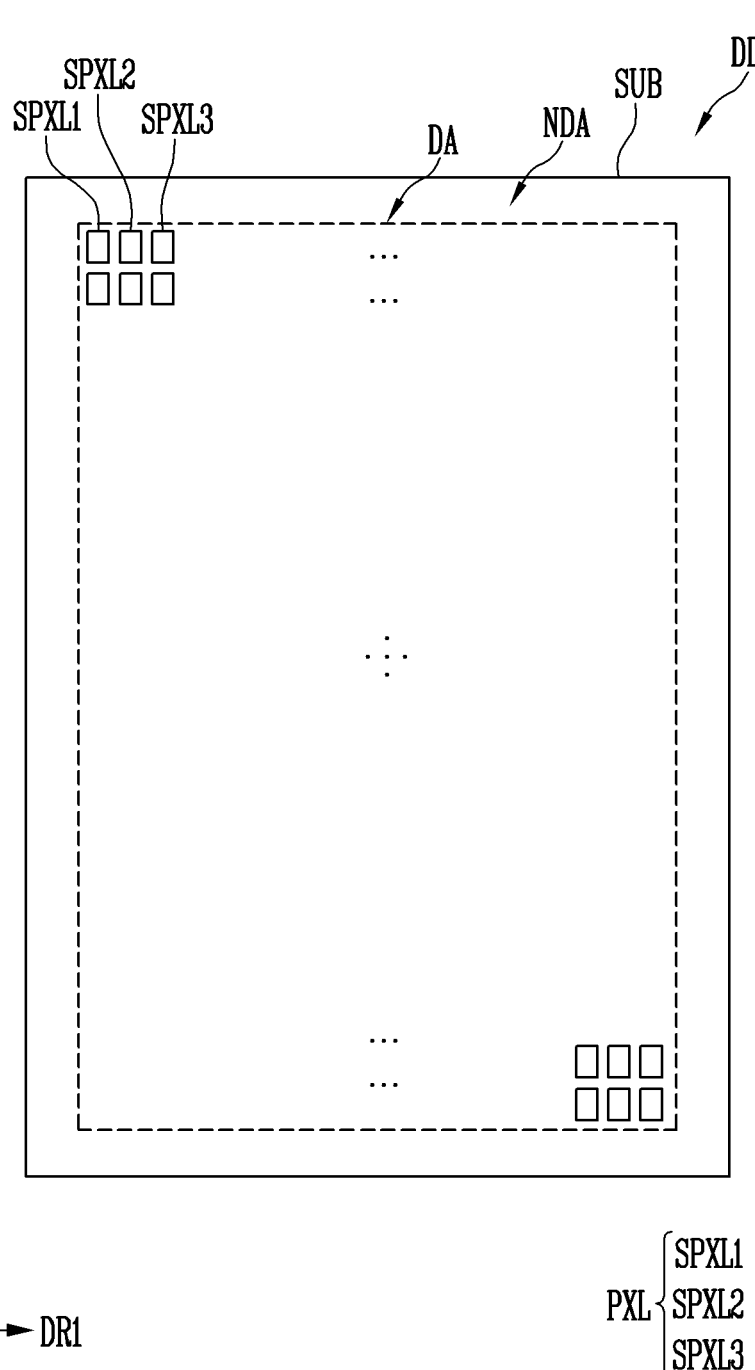
FIG. 5 is a schematic plan view schematically illustrating a display device according to an embodiment.

FIG. 5 is a plan view schematically illustrating a display device according to an embodiment.

The display device DD emits light. Referring to FIG. 5, the display device DD may include a substrate SUB and a pixel PXL disposed on the substrate SUB. Although not shown in the drawing, the display device DD may further include a driving circuit unit (for example, a scan driver and a data driver) for driving the pixel PXL, lines, and pads.

The display device DD may include a display area DA and a non-display area NDA. The non-display area NDA may mean an area except for the display area DA. The non-display area NDA may surround or may be adjacent to at least a portion of the display area DA.

The substrate SUB may be a base member of the display device DD. The substrate SUB may be a rigid or flexible substrate or film, but is not limited to a specific example.

The display area DA may mean an area in which the pixel PXL is disposed. The non-display area NDA may mean an area in which the pixel PXL is not disposed. The driving circuit unit, the lines, and the pads connected to the pixel PXL of the display area DA may be disposed in the non-display area NDA.

According to an example, the pixels PXL may be arranged (or disposed) according to a stripe or PENTILE™ arrangement structure, but the disclosure is not limited thereto, and various embodiments may be applied to the disclosure.

According to an embodiment, the pixel PXL may include a first sub-pixel SPXL1, a second sub-pixel SPXL2, and a third sub-pixel SPXL3. Each of the first sub-pixel SPXL1, the second sub-pixel SPXL2, and the third sub-pixel SPXL3 may be a sub-pixel. At least one of the first sub-pixel SPXL1, the second sub-pixel SPXL2, and the third sub-pixel SPXL3 may be one pixel unit capable of emitting light of various colors.

For example, each of the first sub-pixel SPXL1, the second sub-pixel SPXL2, and the third sub-pixel SPXL3 may emit light of a color. For example, the first sub-pixel SPXL1 may be a red pixel emitting light of red (for example, a first color), the second sub-pixel SPXL2 may be a green pixel emitting light of green (for example, a second color), and the third sub-pixel SPXL3 may be a blue pixel emitting light of blue (for example, a third color). However, a colors, a type, the number, and/or the like of the first sub-pixel SPXL1, the second sub-pixel SPXL2, and the third sub-pixel SPXL3 forming each pixel unit are/is not limited to a specific example.

Hereinafter, a structure of the pixel PXL is described with reference to FIGS. 6 to 17.

First, a sub-pixel SPXL according to an embodiment is described with reference to FIGS. 6 to 9.

Figure 6:
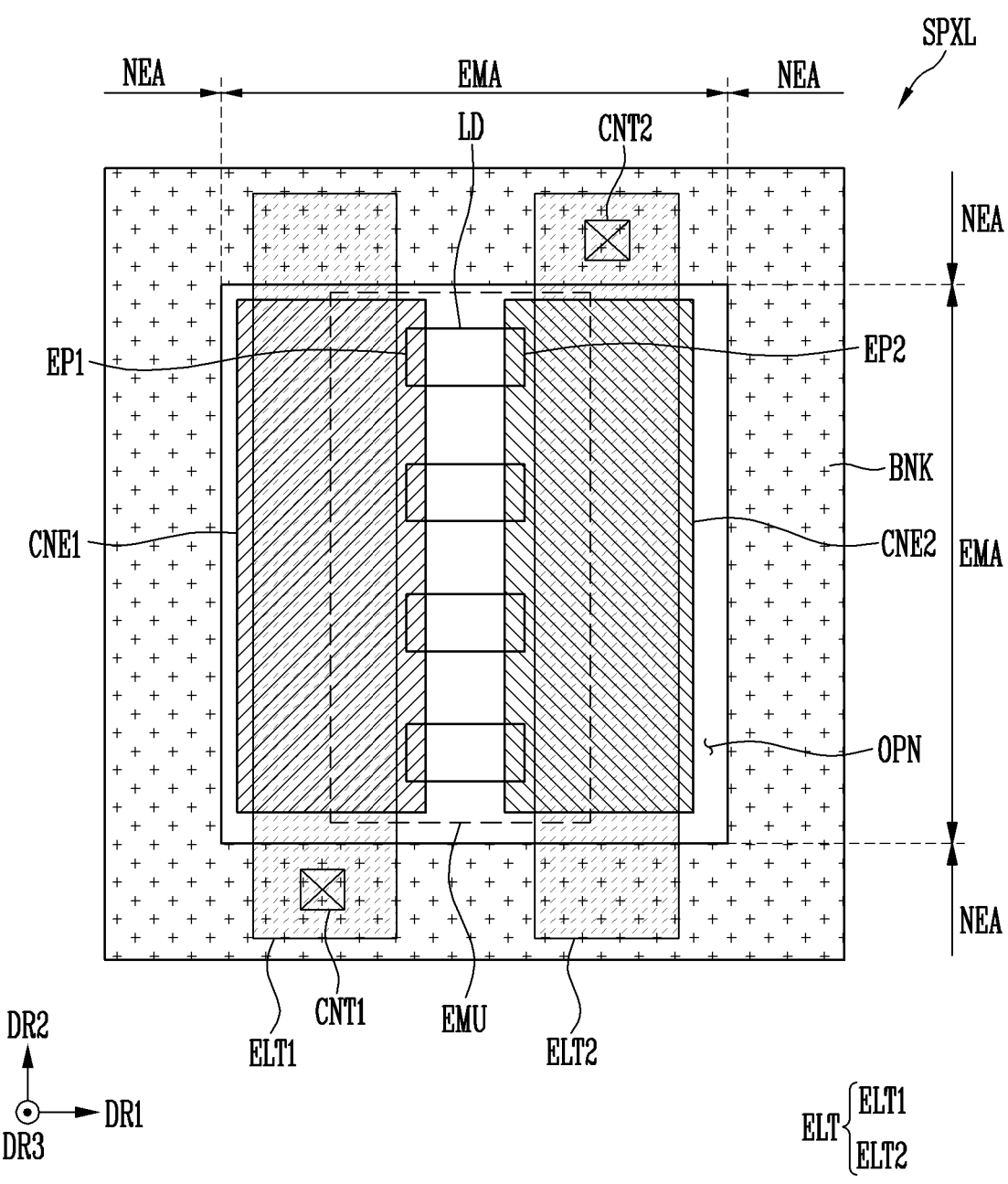
FIGS. 6 and 7 are schematic plan views of a sub-pixel according to an embodiment.
Figure 7:
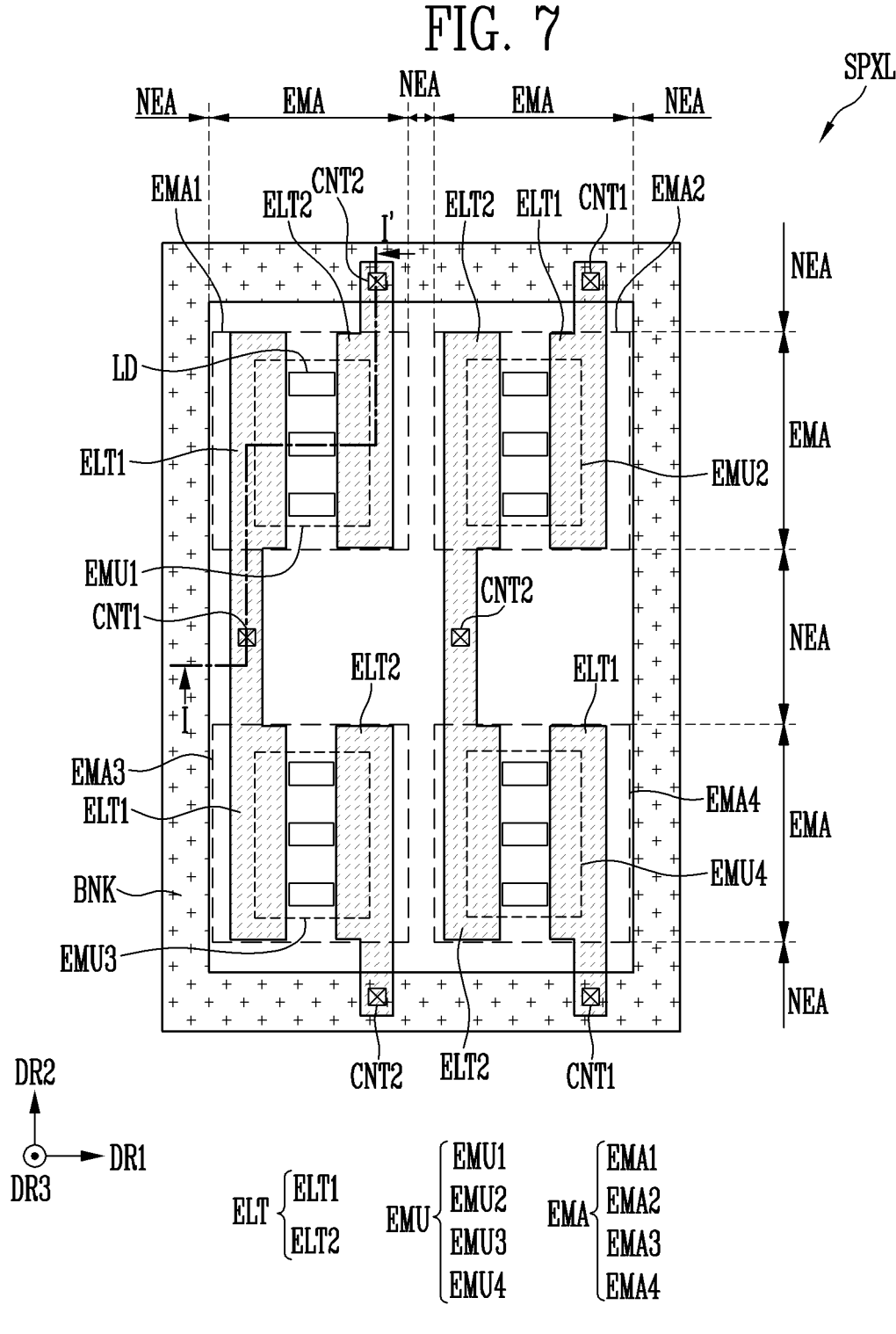

FIGS. 6 and 7 are schematic plan views of a sub-pixel according to an embodiment. The sub-pixel SPXL shown in FIGS. 6 and 7 may be one of the above-described first to third sub-pixels SPXL1, SPXL2, and SPXL3.

FIG. 6 may be a diagram for generally describing a structure including an emission area EMA and a non-emission area NEA of the sub-pixel SPXL.

Referring to FIG. 6, the sub-pixel SPXL (for example, the display device DD) may include the emission area EMA and the non-emission area NEA. The sub-pixel SPXL may include an alignment electrode ELT, light emitting elements LD, a bank BNK, a first contact portion CNT1, and a second contact portion CNT2. According to an embodiment, the alignment electrode ELT may include a first electrode ELT1 and a second electrode ELT2.

The emission area EMA may be an area in which the light emitting element LD is provided and light is emitted. The non-emission area NEA may be an area in which the light emitting element LD is not disposed and light is not emitted.

The emission area EMA may overlap an opening OPN defined by the bank BNK in a plan view. The light emitting elements LD may be disposed in the emission area EMA.

The light emitting elements LD may not be disposed in the non-emission area NEA. A portion of the non-emission area NEA may overlap the bank BNK in a plan view.

The bank BNK may form (or provide) the opening OPN. For example, the bank BNK may have a shape protruding in a thickness direction (for example, a third direction DR3) of the substrate SUB and may have a shape surrounding an area. Accordingly, the opening OPN in which the bank BNK is not disposed may be formed. According to an embodiment, the bank BNK may form a space in which a fluid may be accommodated. For example, the light emitting element LD may be disposed in the opening OPN by providing ink 'INK' of FIG. 23 including the light emitting element LD to the space in which the fluid may be accommodated.

The bank BNK may define the emission area EMA and the non-emission area NEA. The bank BNK may surround at least a portion of the emission area EMA in a plan view. For example, an area in which the bank BNK is disposed may be the non-emission area NEA. As an area in which the bank BNK is not disposed, the area in which the light emitting element LD is disposed may be the emission area EMA.

At least a portion of the light emitting element LD may be disposed between the first electrode ELT1 and the second electrode ELT2. The light emitting element LD may be disposed between the first electrode ELT1 and the second electrode ELT2 in a plan view. According to an embodiment, the light emitting element LD may be entirely disposed between the first electrode ELT1 and the second electrode ELT2. The light emitting element LD may be aligned between the first electrode ELT1 and the second electrode ELT2. The light emitting elements LD may form a light emitting unit EMU. The light emitting unit EMU may refer to a unit including light emitting elements LD adjacent to each other.

The first electrode ELT1 and the second electrode ELT2 may be spaced apart from each other. For example, the first electrode ELT1 and the second electrode ELT2 may be spaced apart from each other along a first direction DR1 in the emission area EMA and each of the first electrode ELT1 and the second electrode ELT2 may extend along a second direction DR2.

The first electrode ELT1 may be a first alignment electrode, and the second electrode ELT2 may be a second alignment electrode.

The first electrode ELT1 and the second electrode ELT2 may receive a first alignment signal and a second alignment signal, respectively, in an alignment step of the light emitting elements LD. The first alignment signal and the second alignment signal may have different waveforms, potentials, and/or phases. Accordingly, an electric field may be formed between the first electrode ELT1 and the second electrode ELT2, and thus the light emitting elements LD may be aligned between the first electrode ELT1 and the second electrode ELT2.

The first electrode ELT1 may be electrically connected to a circuit element (for example, a transistor TR of FIG. 9) through the first contact portion CNT1. The first electrode ELT1 may provide an anode signal. In the specification, the first contact portion CNT1 may refer to a configuration connecting the first electrode ELT1 and one configuration of the pixel circuit layer PCL of FIG. 9.

Figure 9:
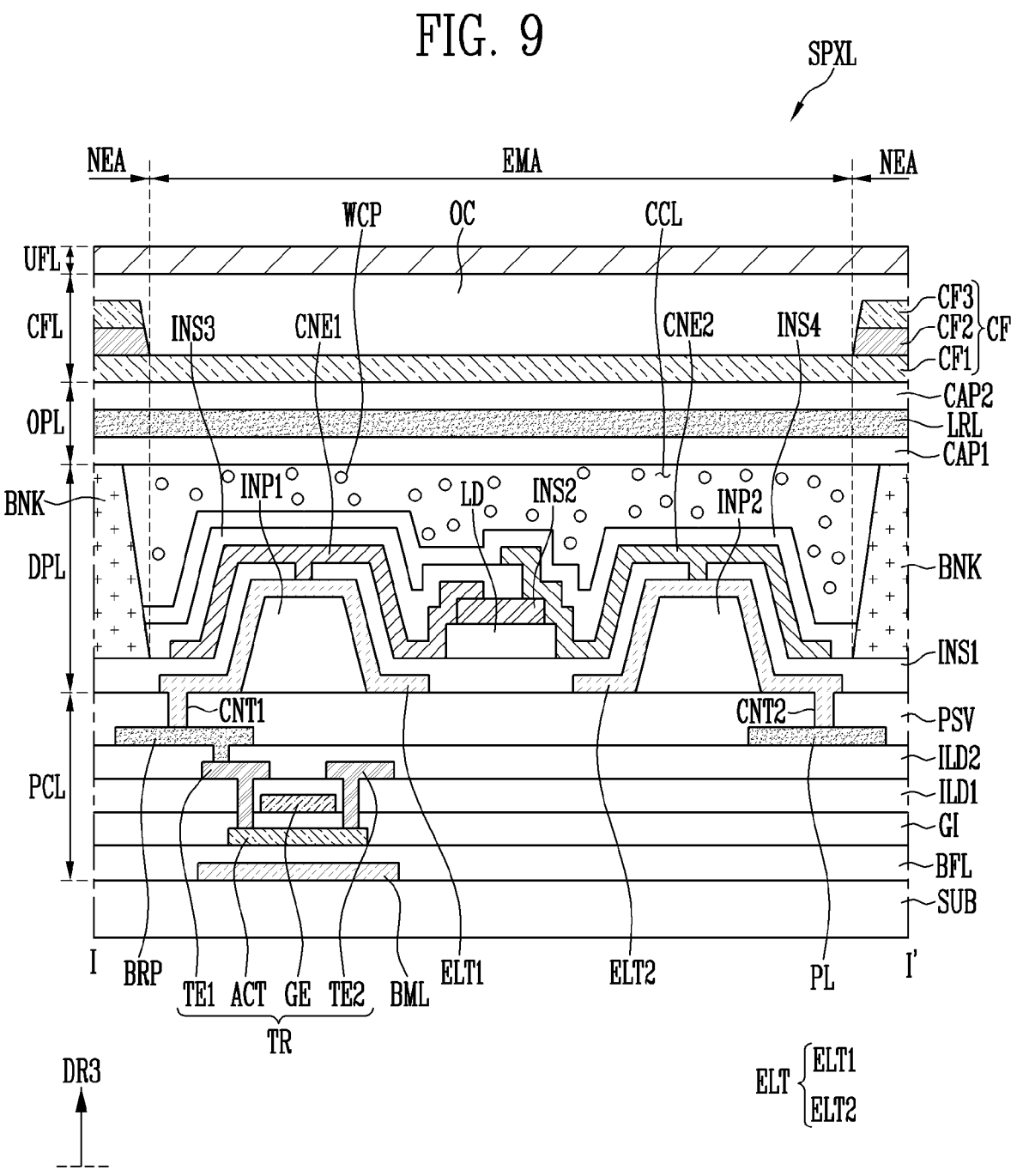
FIG. 9 is a schematic cross-sectional view taken along line I~I' of FIG. 7.

The second electrode ELT2 may be electrically connected to a power line PL of FIG. 9 through the second contact portion CNT2. The second electrode ELT2 may provide a cathode signal. In the specification, the second contact portion CNT2 may refer to a configuration connecting the second electrode ELT2 and one configuration of the pixel circuit layer PCL.

Each of the first and second electrodes ELT1 and ELT2 may be a single layer or multiple layers. For example, each of the first and second electrodes ELT1 and ELT2 may include a reflective electrode layer of at least one layer or a layer including a reflective conductive material, and may selectively further include a transparent electrode layer and/or a conductive capping layer of at least one layer or a layer.

The light emitting elements LD may be aligned between the first electrode ELT1 and the second electrode ELT2. For example, the light emitting elements LD may be aligned and/or connected in parallel with each other between the first electrode ELT1 and the second electrode ELT2.

In an embodiment, each light emitting element LD may be aligned in the second direction DR2 between the first electrode ELT1 and the second electrode ELT2, and may be electrically connected to the first and second electrodes ELT1 and ELT2.

The first end EP1 of the light emitting element LD may be disposed adjacent to the first electrode ELT1, and the second end EP2 of the light emitting element LD may be disposed adjacent to the second electrode ELT2. The first end EP1 may or may not overlap the first electrode ELT1. The second end EP2 may or may not overlap the second electrode ELT2.

In an embodiment, the first end EP1 of each of the light emitting elements LD may be electrically connected to the first electrode ELT1 through a first contact electrode CNE1. In an embodiment, the first end EP1 of each of the light emitting elements LD may be connected to or directly connected to the first electrode ELT1. In an embodiment, the first end EP1 of each of the light emitting elements LD may be electrically connected to only the first contact electrode CNE1 and may not be connected to the first electrode ELT1.

Similarly, the second end EP2 of each of the light emitting elements LD may be electrically connected to the second electrode ELT2 through a second contact electrode CNE2. In an embodiment, the second end EP2 of each of the light emitting elements LD may be connected to or directly connected to the second electrode ELT2. In an embodiment, the second end EP2 of each of the light emitting elements LD may be electrically connected to only the second contact electrode CNE2 and may not be connected to the second electrode ELT2.

The first contact electrode CNE1 and the second contact electrode CNE2 may be disposed on the first ends EP1 and the second ends EP2 of the light emitting elements LD, respectively.

The first contact electrode CNE1 may be disposed on the first ends EP1 to be electrically connected to the first ends EP1 of the light emitting elements LD. In an embodiment, the first contact electrode CNE1 may be disposed on the first electrode ELT1 to be electrically connected to the first electrode ELT1. The first ends EP1 of the light emitting elements LD may be connected to the first electrode ELT1 through the first contact electrode CNE1.

The second contact electrode CNE2 may be disposed on the second ends EP2 to be electrically connected to the second ends EP2 of the light emitting elements LD. In an embodiment, the second contact electrode CNE2 may be disposed on the second electrode ELT2 to be electrically connected to the second electrode ELT2. The second ends EP2 of the light emitting elements LD may be connected to the second electrode ELT2 through the second contact electrode CNE2.

FIG. 7 shows a planar structure of a sub-pixel SPXL according to an embodiment. For example, FIG. 7 shows an embodiment of the sub-pixel SPXL including four light emitting units EMU. However, the disclosure is not limited to the above-described example. For example, the number of light emitting units EMU may be six, and may be appropriately changed according to an embodiment.

Referring to FIG. 7, the sub-pixel SPXL may include light emitting units EMU. For example, the light emitting units EMU may include a first light emitting unit EMU1, a second light emitting unit EMU2, a third light emitting unit EMU3, and a fourth light emitting unit EMU4. Although not explicitly shown in FIG. 7, the first contact electrode CNE1 may be disposed on the first electrode ELT1 so that the first contact electrode CNE1 electrically connects the first electrode ELT1 and the light emitting element LD, and the second contact electrode CNE2 may be disposed on the second electrode ELT2 so that the second contact electrode CNE2 electrically connects the second electrode ELT2 and the light emitting element LD.

The first light emitting unit EMU1 may be disposed in a first emission area EMA1. The second light emitting unit EMU2 may be disposed in a second emission area EMA2. The third light emitting unit EMU3 may be disposed in a third emission area EMA3. The fourth light emitting unit EMU4 may be disposed in a fourth emission area EMA4.

The first to fourth light emitting units EMU1 to EMU4 may be spaced apart from each other. Accordingly, the emission area EMA of the sub-pixel SPXL may be dispersed, and light emitted from the light emitting element LD may be provided throughout an area of the sub-pixel SPXL. For example, according to an embodiment, light may be prevented from being locally emitted.

The light emitting units EMU adjacent to each other in the first direction DR1 may be spaced apart from each other. For example, the first light emitting unit EMU1 and the second light emitting unit EMU2 may be spaced apart from each other. The third light emitting unit EMU3 and the fourth light emitting unit EMU4 may be spaced apart from each other.

Here, the first direction DR1 may mean a direction in which the first electrode ELT1 and the second electrode ELT2 of the light emitting element LD are spaced apart from each other.

An electrode the most adjacent to the second emission area EMA2 among the alignment electrodes ELT disposed in the first emission area EMA1 and an electrode the most adjacent to the first emission area EMA1 among the alignment electrodes ELT disposed in the second emission area EMA2 may provide a same electrical signal (for example, cathode signal). An electrode the most adjacent to the fourth emission area EMA4 among the alignment electrodes ELT disposed in the third emission area EMA3 and an electrode the most adjacent to the third emission area EMA3 among the alignment electrodes ELT disposed in the fourth emission area EMA4 may provide a same electrical signal (for example, cathode signal).

For example, the second electrode ELT2 of the first emission area EMA1 may be disposed adjacent to the second emission area EMA2. The second electrode ELT2 of the second emission area EMA2 may be disposed adjacent to the first emission area EMA1. The second electrode ELT2 of the third emission area EMA3 may be disposed adjacent to the fourth emission area EMA4. The second electrode ELT2 of the fourth emission area EMA4 may be disposed adjacent to the third emission area EMA3.

Even in a case where the light emitting elements LD are dispersedly aligned in the first to fourth emission areas EMA1 to EMA4, the light emitting elements LD may be prevented from being abnormally aligned between the alignment electrodes ELT adjacent to each other in the first direction DR1.

The light emitting units EMU adjacent to each other in the second direction DR2 may be spaced apart from each other. For example, the first light emitting unit EMU1 and the third light emitting unit EMU3 may be spaced apart from each other. The second light emitting unit EMU2 and the fourth light emitting unit EMU4 may be spaced apart from each other.

Here, the second direction DR2 may refer to a direction in which the light emitting elements LD may be sequentially arranged.

The first light emitting unit EMU1 and the third light emitting unit EMU3 may be spaced apart from each other along the second direction DR2 with the non-emission area NEA, in which the light emitting element LD is not disposed, interposed therebetween.

The second light emitting unit EMU2 and the fourth light emitting unit EMU4 may be spaced apart from each other along the second direction DR2 with the non-emission area NEA, in which the light emitting element LD is not disposed, interposed therebetween.

According to an embodiment, although not shown in the drawing, the bank BNK may be further disposed between the first light emitting unit EMU1 and the third light emitting unit EMU3, and the bank BNK may be further disposed between the second light emitting unit EMU2 and the fourth light emitting unit EMU4. However, the disclosure is not necessarily limited to the above.

According to an embodiment, an average width of the alignment electrode ELT disposed in the non-emission area NEA in the opening OPN may be less than an average width of the alignment electrodes ELT disposed in the emission area EMA. The light emitting element LD may be closely aligned between the first electrode ELT1 and the second electrode ELT2 in the emission area EMA. This is described with reference to FIG. 8.

Figure 8:
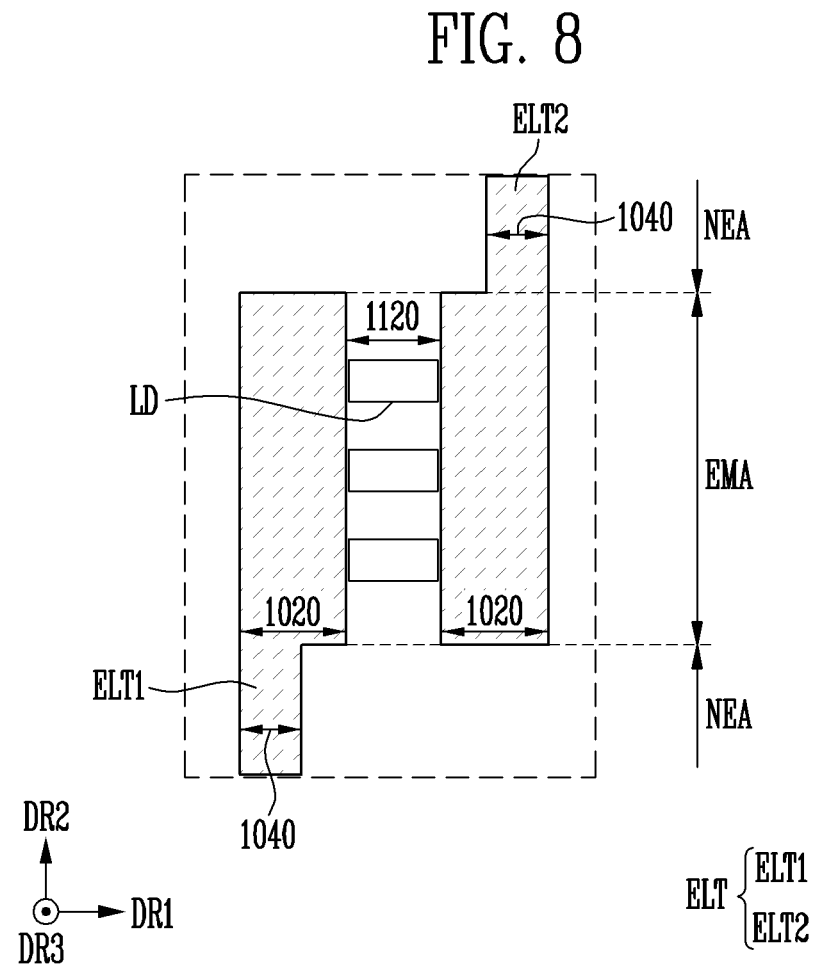

FIG. 8 is a plan view schematically illustrating the emission area. An area shown in FIG. 8 may refer to one of the first to fourth emission areas EMA1 to EMA4 and an area adjacent thereto.

Referring to FIG. 8, the first electrode ELT1 and the second electrode ELT2 may have a first width 1020 in the emission area EMA and a second width 1040 in the non-emission area NEA. At this time, the first width 1020 may be greater than the second width 1040.

According to the embodiment, at a position where the light emitting element LD is to be disposed, the alignment electrodes ELT may be arranged so that the width of the alignment electrodes is large, and thus a distance 1120 between the first electrode ELT1 and the second electrode ELT2 may be provided to be small. In case that the first and second alignment signals are provided to the first electrode ELT1 and the second electrode ELT2, a strong electric field may be formed at a position corresponding to the distance 1120. Accordingly, the light emitting elements LD may be predominantly arranged at the position corresponding to the distance 1120. Finally, the light emitting elements LD may be appropriately arranged at a desired position, and as described above, the light emitting elements LD may be prevented from being locally arranged in the sub-pixel SPXL.

Referring to FIG. 9, a cross-sectional structure of a sub-pixel SPXL according to an embodiment is described.

FIG. 9 is a schematic cross-sectional view taken along line I~I' of FIG. 7. FIG. 9 is a schematic cross-sectional view schematically illustrating a sub-pixel SPXL according to an embodiment. In FIG. 9, a stack structure of the sub-pixel SPXL is shown.

Referring to FIG. 9, the sub-pixel SPXL may include a substrate SUB, a pixel circuit layer PCL, a display element layer DPL, an optical layer OPL, a color filter layer CFL, and an outer film layer UFL.

The substrate SUB may form a base member of the sub-pixel SPXL. The substrate SUB may provide an area in which the pixel circuit layer PCL and the display element layer DPL may be disposed.

The pixel circuit layer PCL may be disposed on the substrate SUB. The pixel circuit part PCL may include a lower sub-electrode BML, a buffer layer BFL, a transistor TR, a gate insulating layer GI, a first interlayer insulating layer ILD1, a second interlayer insulating layer ILD2, a bridge pattern BRP, a power line PL, a protective layer PSV, a first contact portion CNT1, and a second contact portion CNT2.

The lower sub-electrode BML may be disposed on the substrate SUB. The lower sub-electrode BML may function as a path through which an electrical signal moves. According to an embodiment, a portion of the lower sub-electrode BML may overlap the transistor TR in a plan view.

The buffer layer BFL may be disposed on the substrate SUB. The buffer layer BFL may cover the lower sub-electrode BML. The buffer layer BFL may prevent an impurity from being diffused from the outside. The buffer layer BFL may include one of silicon oxide ($SiO_x$) and silicon nitride ($SiN_x$), silicon oxynitride ($SiO_xN_y$), aluminum oxide ($AlO_x$), and titanium oxide ($TiO_x$). However, the disclosure is not necessarily limited to the above-described example.

The transistor TR may be a thin film transistor. According to an embodiment, the transistor TR may be a driving transistor. The transistor TR may be electrically connected to the light emitting element LD.

The transistor TR may include an active layer ACT, a first transistor electrode TE1, a second transistor electrode TE2, and a gate electrode GE.

The active layer ACT may refer to a semiconductor layer. The active layer ACT may be disposed on the buffer layer BFL. The active layer ACT may include at least one of polysilicon, low temperature polycrystalline silicon (LTPS), amorphous silicon, and an oxide semiconductor.

The active layer ACT may include a first contact area that is in contact with the first transistor electrode TE1 and a second contact area that is in contact with the second transistor electrode TE2. The first contact area and the second contact area may be semiconductor patterns doped with an impurity. An area between the first contact area and the second contact area may be a channel area. The channel area may be an intrinsic semiconductor pattern that is not doped with an impurity.

The gate electrode GE may be disposed on the gate insulating layer GI. A position of the gate electrode GE may correspond to a position of the channel area of the active layer ACT. For example, the gate electrode GE may be disposed on the channel area of the active layer ACT with the gate insulating layer GI interposed therebetween.

The gate insulating layer GI may be disposed on the active layer ACT. The gate insulating layer GI may include an inorganic material. For example, the gate insulating layer GI may include one of silicon oxide (SiO$_x$), silicon nitride (SiN$_x$), silicon oxynitride (SiO$_x$N$_y$), aluminum oxide (AlO$_x$), and titanium oxide (TiO$_x$). However, the disclosure is not necessarily limited to the above-described example.

The first interlayer insulating layer ILD1 may be disposed on the gate electrode GE. The first interlayer insulating layer ILD1 may include an inorganic material. For example, the first interlayer insulating layer ILD1 may include one of silicon oxide (SiO$_x$), silicon nitride (SiN$_x$), silicon oxynitride (SiO$_x$N$_y$), aluminum oxide (AlO$_x$), and titanium oxide (TiO$_x$). However, the disclosure is not necessarily limited to the above-described example.

The first transistor electrode TE1 and the second transistor electrode TE2 may be disposed on the first interlayer insulating layer ILD1. The first transistor electrode TE1 may be in contact with the first contact area of the active layer ACT by passing through the gate insulating layer GI and the first interlayer insulating layer ILD1, and the second transistor electrode TE2 may be in contact with the second contact area of the active layer ACT by passing through the gate insulating layer GI and the first interlayer insulating layer ILD1. For example, the first transistor electrode TE1 may be a drain electrode and the second transistor electrode TE2 may be a source electrode, but are not limited thereto.

The first transistor electrode TE1 may be electrically connected to the first electrode ELT1 through the first contact portion CNT1 formed in the protective layer PSV.

The second interlayer insulating layer ILD2 may be disposed on the first transistor electrode TE1 and the second transistor electrode TE2. The second interlayer insulating layer ILD2 may include an inorganic material. For example, the second interlayer insulating layer ILD2 may include one of silicon oxide (SiO$_x$), silicon nitride (SiN$_x$), silicon oxynitride (SiO$_x$N$_y$), aluminum oxide (AlO$_x$), and titanium oxide (TiO$_x$). However, the disclosure is not necessarily limited to the above-described example.

The bridge pattern BRP may be disposed on the second interlayer insulating layer ILD2. The bridge pattern BRP may be electrically connected to the first electrode ELT1 through the first contact portion CNT1 formed in the protective layer PSV. For example, the bridge pattern BRP may electrically connect the first transistor electrode TE1 and the first electrode ELT1. According to an embodiment, the bridge pattern BRP may be a path through which a signal provided from the transistor TR moves, and may be a path through which the alignment signal provided to the first electrode ELT1 moves.

The power line PL may be disposed on the second interlayer insulating layer ILD2. The power line PL may be electrically connected to the second electrode ELT2 through the second contact portion CNT2 formed in the protective layer PSV. According to an embodiment, the power line PL may be a path through which a signal (for example, a cathode signal) provided for the light emitting element LD to emit light is supplied. The power line PL may be a path through which the alignment signal provided to the second electrode ELT2 moves.

The protective layer PSV may be disposed on the second interlayer insulating layer ILD2. The protective layer PSV may include an inorganic material. For example, the protective layer PSV may include one of silicon oxide (SiO$_x$), silicon nitride (SiN$_x$), silicon oxynitride (SiO$_x$N$_y$), aluminum oxide (AlO$_x$), and titanium oxide (TiO$_x$). However, the disclosure is not necessarily limited to the above-described example. According to an embodiment, the protective layer PSV may include an organic material.

According to an embodiment, the protective layer PSV may be a via layer.

The display element layer DPL may be disposed on the pixel circuit layer PCL. The display element part DPL may include a first insulating pattern INP1, a second insulating pattern INP2, the first electrode ELT1, the second electrode ELT2, a first insulating layer INS1, the bank BNK, the light emitting element LD, a second insulating layer INS2, the first contact electrode CNE1, a third insulating layer INS3, and the second contact electrode CNE2.

The first insulating pattern INP1 and the second insulating pattern INP2 may be disposed on the protective layer PSV. The first insulating pattern INP1 and the second insulating pattern INP2 may have a shape protruding in the thickness direction (for example, the third direction DR3) of the substrate SUB. The first insulating pattern INP1 and the second insulating pattern INP2 may include an organic material and/or an inorganic material.

The first electrode ELT1 and the second electrode ELT2 may be disposed on the protective layer PSV. According to an embodiment, at least a portion of the first electrode ELT1 may be arranged on the first insulating pattern INP1, and at least a portion of the second electrode ELT2 may be arranged on the second insulating pattern INP2, and thus each may function as a reflective partition wall.

The first electrode ELT1 may be electrically connected to the transistor TR through the first contact portion CNT1. The second electrode ELT2 may be electrically connected to the power line PL through the second contact portion CNT2.

The first electrode ELT1 may be electrically connected to the light emitting element LD. The first electrode ELT1 may be electrically connected to the first contact electrode CNE1 through a contact hole formed in the first insulating layer INS1. The first electrode ELT1 may provide an anode signal to the light emitting element LD.

The second electrode ELT2 may be electrically connected to the light emitting element LD. The second electrode ELT2 may be electrically connected to the second contact electrode CNE2 through a contact hole formed in the first insulating layer INS1. The second electrode ELT2 may provide a cathode signal (for example, a ground signal) to the light emitting element LD.

The first electrode ELT1 and the second electrode ELT2 may include a conductive material. For example, the first electrode ELT1 and the second electrode ELT2 may include one of silver (Ag), magnesium (Mg), aluminum (Al), platinum (Pt), palladium (Pd), gold (Au), nickel (Ni), neodymium (Nd), iridium (Ir), chromium (Cr), titanium (Ti), or an alloy thereof. However, the disclosure is not limited to the above-described example.

The first insulating layer INS1 may be disposed on the protective layer PSV. The first insulating layer INS1 may cover the first electrode ELT1 and the second electrode ELT2. The first insulating layer INS1 may stabilize a connection between electrode configurations and reduce an external influence. The first insulating layer INS1 may include one of silicon oxide (SiO$_x$), silicon nitride (SiN$_x$), silicon oxynitride (SiO$_x$N$_y$), aluminum oxide (AlO$_x$), and titanium oxide (TiO$_x$).

The bank BNK may be disposed on the first insulating layer INS1. The bank BNK may have a shape protruding in the thickness direction (for example, the third direction DR3) of the substrate SUB.

According to an embodiment, the bank BNK may reflect light by including a reflective material. For example, the bank BNK may recycle light emitted from the light emitting element LD to improve emission efficiency of the sub-pixel SPXL. According to an embodiment, the bank BNK may include a metal oxide having a reflective property. For example, the bank BNK may include titanium oxide ($TiO_x$). However, the disclosure is not limited to the above-described example.

The bank BNK may not overlap the emission area EMA in a plan view. The bank BNK may overlap the non-emission area NEA in a plan view.

The light emitting element LD may be disposed on the first insulating layer INS1. According to an embodiment, the light emitting element LD may emit light based on an electrical signal provided from the first contact electrode CNE1 and the second contact electrode CNE2.

According to an embodiment, the light emitting element LD may emit light of a third color (for example, blue). A color conversion unit CCL and a color filter layer CFL may be provided to such sub-pixels SPXL, and thus a full-color image may be displayed. However, the disclosure is not necessarily limited thereto, light emitting elements LD emitting light of different colors may be provided to the sub-pixels SPXL, respectively.

A portion of the second insulating layer INS2 may be disposed on the light emitting element LD. The second insulating layer INS2 may cover the active layer AL of the light emitting element LD. According to an embodiment, the second insulating layer INS2 may include an organic material or an inorganic material.

According to an embodiment, the second insulating layer INS2 may expose at least a portion of the light emitting element LD. For example, the second insulating layer INS2 may not cover the first end EP1 and the second end EP2 of the light emitting element LD, and thus the first end EP1 and the second end EP2 of the light emitting element LD may be exposed and may be electrically connected to the first contact electrode CNE1 and the second contact electrode CNE2, respectively.

The first contact electrode CNE1 and the second contact electrode CNE2 may be disposed on the first insulating layer INS1. According to an embodiment, the first contact electrode CNE1 may be disposed on the first insulating layer INS1 and the second insulating layer INS2, and the second contact electrode CNE2 may be disposed on the first insulating layer INS1, the second insulating layer INS2, and the third insulating layer INS3.

The first contact electrode CNE1 may electrically connect the first electrode ELT1 and the light emitting element LD, and the second contact electrode CNE2 may electrically connect the second electrode ELT2 and the light emitting element LD.

The first contact electrode CNE1 and the second contact electrode CNE2 may include a conductive material. For example, the first contact electrode CNE1 and the second contact electrode CNE2 may include a transparent conductive material including indium tin oxide (ITO), indium zinc oxide (IZO), and indium tin zinc oxide (ITZO), but the disclosure is not limited thereto.

The third insulating layer INS3 may be disposed on the first contact electrode CNE1. The third insulating layer INS3 may prevent a short circuit between the first contact electrode CNE1 and the second contact electrode CNE2. The third insulating layer INS3 may include an inorganic material. For example, the third insulating layer INS3 may include one of silicon oxide ($SiO_x$), silicon nitride ($SiN_x$), silicon oxynitride ($SiO_xN_y$), aluminum oxide ($AlO_x$), and titanium oxide ($TiO_x$). However, the disclosure is not necessarily limited to the above-described example.

The fourth insulating layer INS4 may be disposed on the third insulating layer INS3 and the second contact electrode CNE2. The fourth insulating layer INS4 may protect the display element layer DPL from an external influence. The fourth insulating layer INS4 may include an inorganic material. For example, the fourth insulating layer INS4 may include one of silicon oxide ($SiO_x$), silicon nitride ($SiN_x$), silicon oxynitride ($SiO_xN_y$), aluminum oxide ($AlO_x$), and titanium oxide ($TiO_x$). However, the disclosure is not necessarily limited to the above-described example.

According to an embodiment, the display element layer DPL may further include the color conversion unit CCL. However, the disclosure is not limited thereto, and according to an embodiment, the color conversion unit CCL may be separately provided on a layer different from that of the display element layer DPL. For convenience of description, an embodiment in which the color conversion unit CCL is disposed on a same layer as the display element layer DPL is described.

The color conversion unit CCL may change a wavelength of light provided from the light emitting element LD or transmit the light.

For example, in case that the sub-pixel SPXL is the first sub-pixel SPXL1 emitting the light of the first color (for example, red), a wavelength conversion pattern WCP of the color conversion unit CCL may include first color conversion particles that convert the light of the third color into the light of the first color. The first color conversion particles may include a first quantum dot that converts the light of blue into the light of red. The first quantum dot may absorb the blue light and shift a wavelength according to an energy transition to emit the red light.

According to another example, in case that the sub-pixel SPXL is the second sub-pixel SPXL2 emitting the light of the second color (for example, green), the wavelength conversion pattern WCP of the color conversion unit CCL may include second color conversion particles that convert the light of the third color into the light of the second color. The second color conversion particles may include a second quantum dot that converts the blue light into the green light. The second quantum dot may absorb the blue light and shift a wavelength according to an energy transition to emit the green light.

The first quantum dot and the second quantum dot may have a spherical shape, a pyramidal shape, a multi-arm shape, a shape of a cubic nanoparticle, nanotube, nanowire, nanofiber, or nanoplatelet particle, or the like, but are not necessarily limited thereto, and the shape of the first quantum dot and the second quantum dot may be variously changed.

According to another example, in case that the sub-pixel SPXL is the third sub-pixel SPXL3 emitting the light of the third color (for example, blue), the color conversion unit CCL may include a light transmission pattern (not shown). The light transmission pattern may be for efficiently using the light emitted from the light emitting element LD, and may include light scattering particles dispersed in a matrix material such as a base resin. For example, the light transmission pattern may include light scattering particles such as silica, but a configuration material of the light scattering particles is not limited thereto.

The optical layer OPL may be disposed on the display element layer DPL. According to an embodiment, the optical layer OPL may include a first capping layer CAP1, a low refractive layer LRL, and a second capping layer CAP2.

The first capping layer CAP1 may seal (or cover) the color conversion unit CCL. The first capping layer CAP1 may be disposed between the low refractive layer LRL and the display element layer DPL. The first capping layer CAP1 may be provided over the sub-pixels SPXL. The first capping layer CAP1 may prevent an impurity such as moisture or air from penetrating from the outside and damaging or contaminating the color conversion unit CCL.

According to an embodiment, the first capping layer CAP1 may include at least one of silicon nitride ($SiN_x$), silicon oxide ($SiO_x$), silicon oxynitride ($SiO_xN_y$), and aluminum oxide ($AlO_x$).

The low refractive layer LRL may be disposed between the first capping layer CAP1 and the second capping layer CAP2. The low refractive layer LRL may be disposed between the color conversion unit CCL and the color filter layer CFL. The low refractive layer LRL may be provided over the sub-pixels SPXL.

The low refractive layer LRL may improve light efficiency by recycling light provided from the color conversion unit CCL. To this end, the low refractive layer LRL may have a refractive index lower than that of the color conversion unit CCL.

According to an embodiment, the low refractive layer LRL may include a base resin and a hollow particle dispersed in the base resin. The hollow particle may include a hollow silica particle. By way of example, the hollow particle may be a pore formed by porogen, but is not necessarily limited thereto. The low refractive layer LRL may include one of a zinc oxide ($ZnO_x$) particle, a titanium oxide ($TiO_x$) particle, and a nano silicate particle, but is not necessarily limited thereto.

The second capping layer CAP2 may be disposed on the low refractive layer LRL. The second capping layer CAP2 may be disposed between the color filter layer CFL and the low refractive layer LRL. The second capping layer CAP2 may be provided over the sub-pixels SPXL. The second capping layer CAP2 may prevent an impurity such as moisture or air from penetrating from the outside and damaging or contaminating the low refractive layer LRL.

According to an embodiment, the second capping layer CAP2 may include one of silicon nitride ($SiN_x$), silicon oxide ($SiO_x$), silicon oxynitride ($SiO_xN_y$), and aluminum oxide ($AlO_x$).

The color filter layer CFL may be disposed on the second capping layer CAP2. The color filter layer CFL may be provided over the sub-pixels SPXL. The color filter layer CFL may include color filters CF1, CF2, and CF3 and an overcoat layer OC.

The color filters CF1, CF2, and CF3 may be disposed on the second capping layer CAP2.

According to an embodiment, in case that the sub-pixel SPXL is the first sub-pixel SPXL1 emitting the light of the first color, the emission area from which the light of the light emitting element LD is emitted may overlap the first color filter CF1 and may not overlap the second color filter CF2 and the third color filter CF3 in a plan view. FIG. 9 shows an embodiment in which the sub-pixel SPXL is the first sub-pixel SPXL1.

According to an embodiment, in case that the sub-pixel SPXL is the second sub-pixel SPXL2 emitting the light of the second color, the emission area from which the light of the light emitting element LD is emitted may overlap the second color filter CF2 and may not overlap the first color filter CF1 and the third color filter CF3 in a plan view.

According to an embodiment, in case that the sub-pixel SPXL is the third sub-pixel SPXL3 emitting the light of the third color, the emission area from which the light of the light emitting element LD is emitted may overlap the third color filter CF3 and may not overlap the first color filter CF1 and the second color filter CF2 in a plan view.

The first color filter CF1 may transmit the light of the first color, and may not transmit the light of the second color and the light of the third color. For example, the first color filter CF1 may include a colorant related to the first color.

The second color filter CF2 may transmit the light of the second color, and may not transmit the light of the first color and the light of the third color. For example, the second color filter CF2 may include a colorant related to the second color.

The third color filter CF3 may transmit the light of the third color, and may not transmit the light of the first color and the light of the second color. For example, the third color filter CF3 may include a colorant related to the third color.

The overcoat layer OC may be disposed on the color filters CF. The overcoat layer OC may be provided over the sub-pixels SPXL. The overcoat layer OC may cover a lower member including the color filters CF. The overcoat layer OC may prevent moisture or air from penetrating into the above-described lower member. The overcoat layer OC may protect the above-described lower member from a foreign substance such as dust.

According to an embodiment, the overcoat layer OC may include an organic material such as an acrylates resin, an epoxy resin, a phenolic resin, a polyamides resin, a polyimides resin, polyesters resin, polyphenylenesulfides resin, or benzocyclobutene (BCB). However, the disclosure is not necessarily limited to the above-described example.

The outer film layer UFL may be disposed on the color filter layer CFL. The outer film layer UFL may be disposed outside the display device DD to reduce an external influence. The outer film layer UFL may be provided over the sub-pixels SPXL. According to an embodiment, the outer film layer UFL may include one of a polyethyleneterephthalate (PET) film, a low reflective film, a polarization film, and a transmittance controllable film, but is not necessarily limited thereto.

For example, the outer film layer UFL may include an anti-reflective (AR) coating layer for reducing a light reflectance. The AR coating layer may refer to a configuration in which a material having an anti-reflective function is applied to one surface or a surface of a given configuration. Here, the applied material may have a low reflectance.

Hereinafter, a structure of the sub-pixel SPXL according to an embodiment is described with reference to FIGS. 10 to 16. A content that may overlap the above-described content is simplified or is not repeated.

Figure 10:
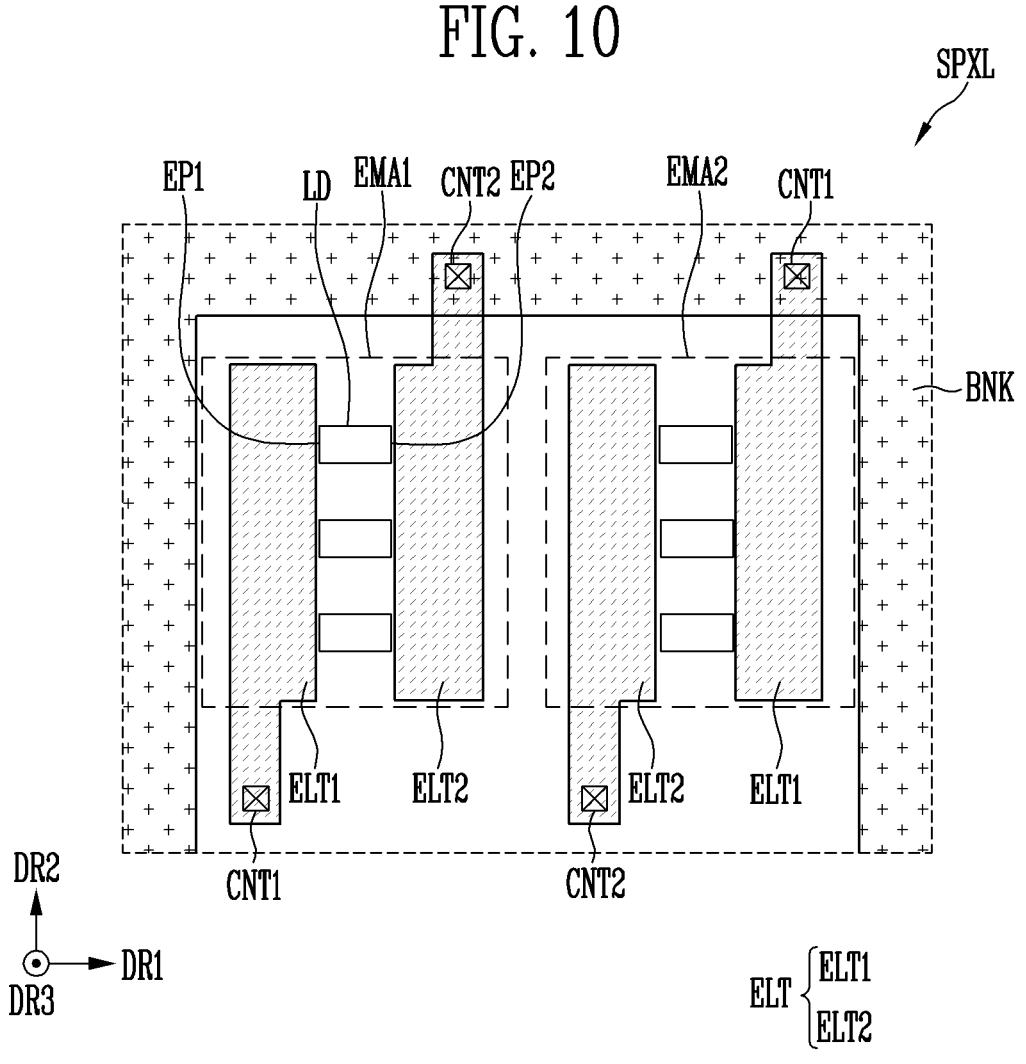
FIGS. 10 to 12 are schematic plan views illustrating a sub-pixel according to an embodiment.
Figure 11:
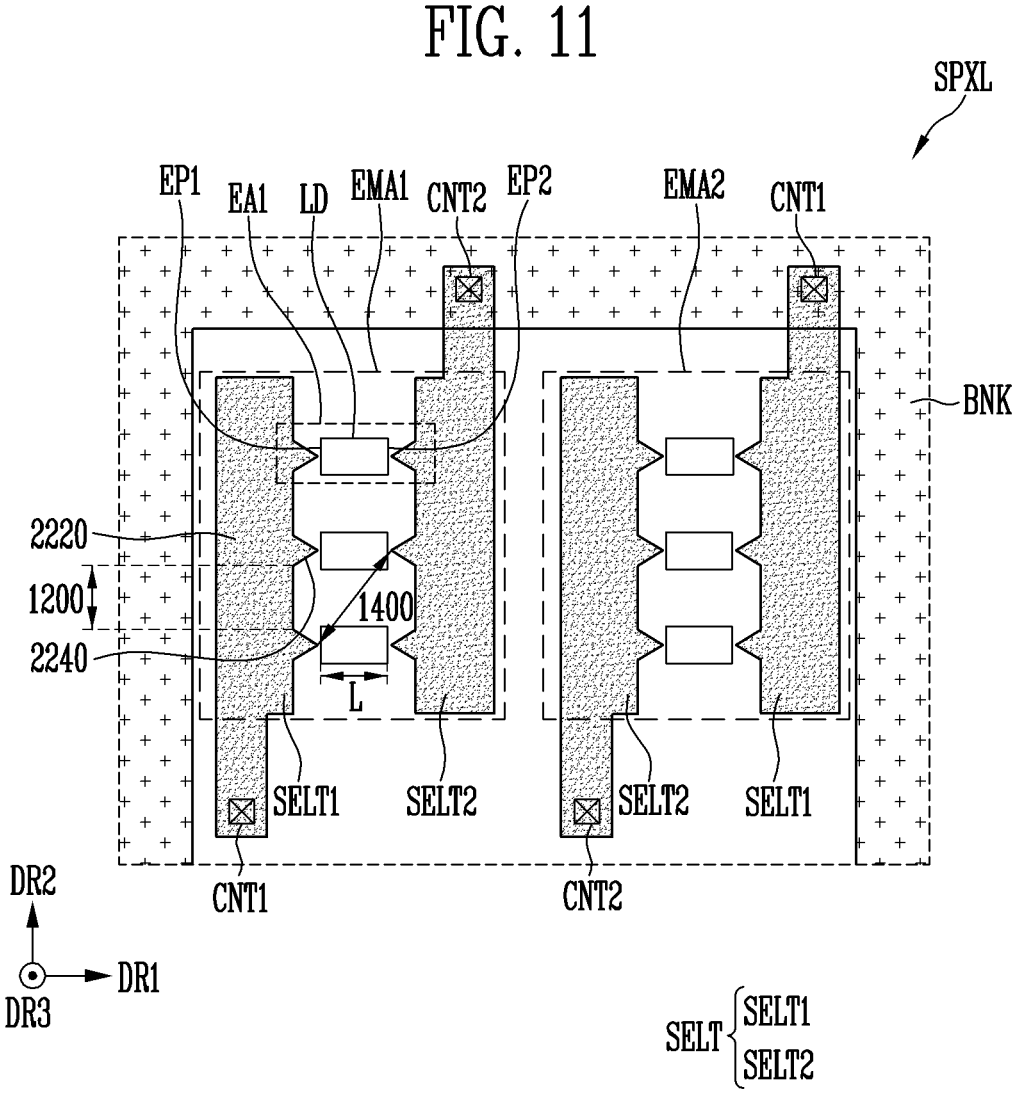
Figure 12:
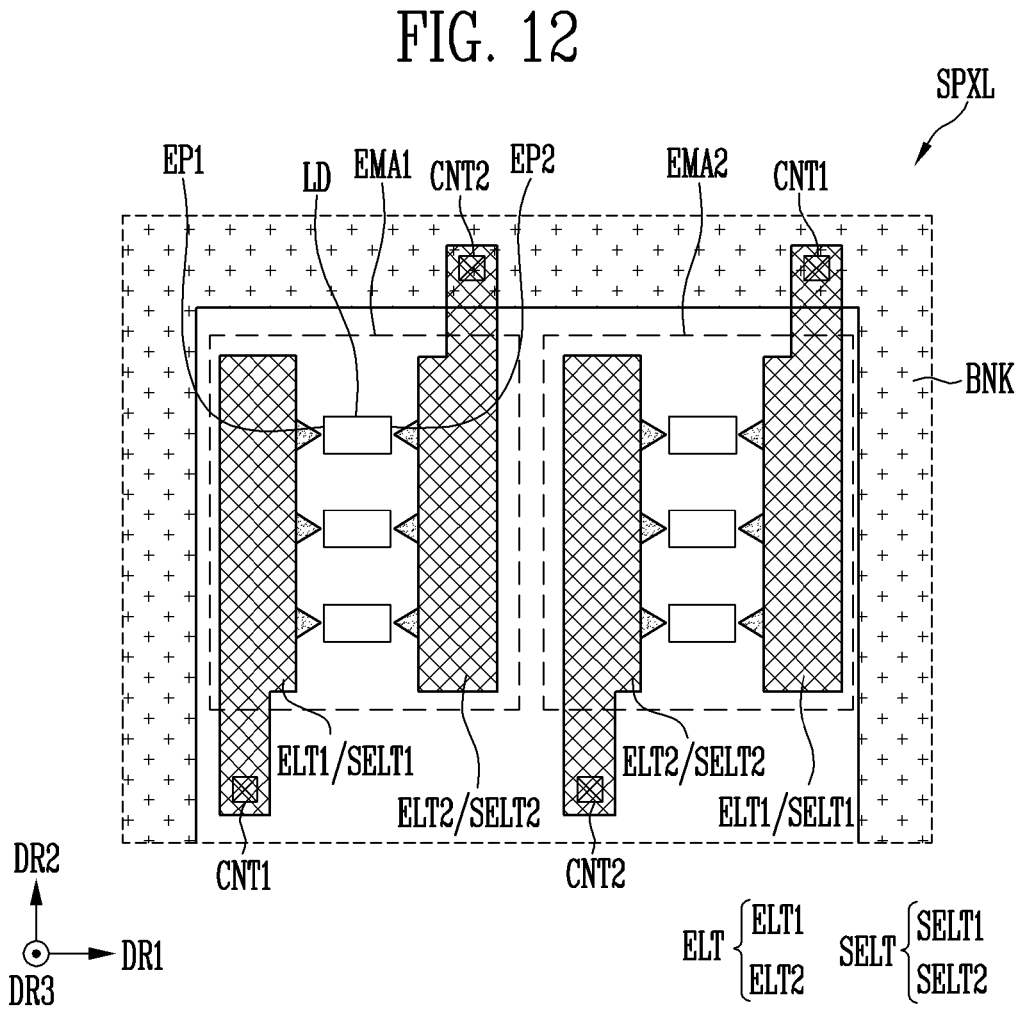

FIGS. 10 to 12 are schematic plan views illustrating a sub-pixel according to an embodiment. In FIGS. 10 to 12, for convenience of description, the first emission area EMA1 and the second emission area EMA2 described above with reference to FIG. 7 are shown.

In order to clearly show configurations of the sub-pixels SPXL, the first electrode ELT1 and the second electrode ELT2 are shown in FIG. 10, and a first sub-electrode SELT1 and a second sub-electrode SELT2 are shown in FIG. 11. FIG. 12 shows a structure in which FIGS. 10 and 11 overlap. An area where a sub-electrode SELT and the alignment electrode ELT overlap is expressed by a pattern so that the drawing is clearly shown (refer to FIG. 12).

Figure 13:
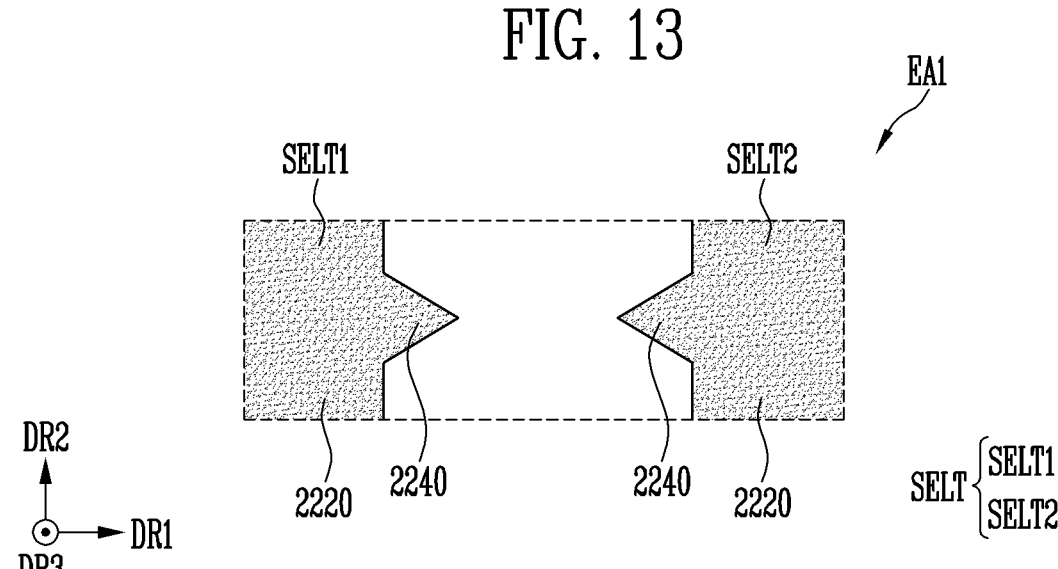
FIG. 13 is a schematic enlarged view of an area EA1 shown in FIG. 11.

FIG. 13 is a schematic enlarged view of an area EA1 shown in FIG. 11. FIG. 13 shows a schematic enlarged structure of the sub-electrode SELT.

Figure 14:
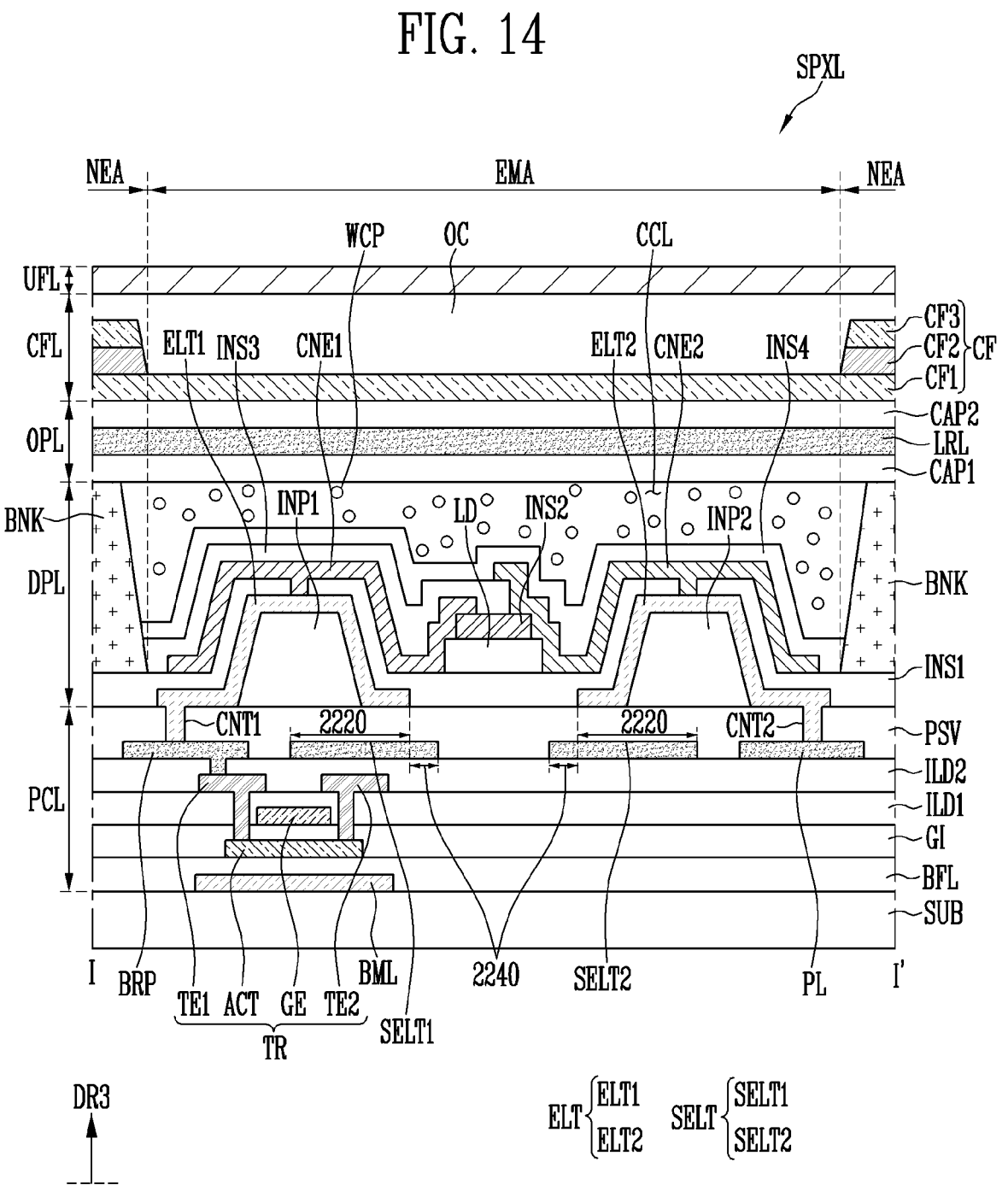
FIG. 14 is a schematic cross-sectional view of a sub-pixel according to an embodiment, and is a view illustrating a cross-sectional structure corresponding to FIG. 9.

FIG. 14 is a schematic cross-sectional view of a sub-pixel according to an embodiment, and is a view illustrating a cross-sectional structure corresponding to FIG. 9.

Referring to FIGS. 10 to 14, the sub-pixel SPXL according to an embodiment is an electrode structure for aligning the light emitting element LD, and is different from the sub-pixel SPXL according to an embodiment described above, in that the sub-pixel SPXL according to the other embodiment further may include the sub-electrode SELT.

An electric field may be formed to align the light emitting elements LD. At this time, the formed electric field may be based on an electrical signal provided to the alignment electrode ELT and the sub-electrode SELT. According to an embodiment, the sub-electrode SELT may include a first sub-electrode SELT1 and a second sub-electrode SELT2.

The sub-electrode SELT may overlap the alignment electrode ELT in a plan view. The sub-electrode SELT may be disposed on a same layer as one of the conductive layers included in the pixel circuit layer PCL. Accordingly, the sub-electrode SELT may be closer to the substrate SUB than the alignment electrode ELT. The sub-electrode SELT may be further spaced apart from the light emitting element LD compared to the alignment electrode ELT (refer to FIG. 14).

For example, the sub-electrode SELT may be disposed on a same layer as one of the lower sub-electrode BML, the gate electrode GE, the first and second transistor electrodes TE1 and TE2, and the bridge pattern BRP. According to an embodiment, the sub-electrode SELT may be spaced apart from the bridge pattern BRP and may be disposed on the second interlayer insulating layer ILD2.

Hereinafter, for convenience of description, an embodiment in which the sub-electrode SELT is disposed on a same layer as the bridge pattern BRP is described as a reference.

The first sub-electrode SELT1 may overlap the first electrode ELT1 in a plan view. The first sub-electrode SELT1 may be disposed on a same layer as one of the conductive layers included in the pixel circuit layer PCL. Accordingly, the first sub-electrode SELT1 may be closer to the substrate SUB compared to the first electrode ELT1. The first sub-electrode SELT1 may be spaced apart from the light emitting element LD compared to the first electrode ELT1.

The second sub-electrode SELT2 may overlap the second electrode ELT2 in a plan view. The second sub-electrode SELT2 may be disposed on a same layer as one of the conductive layers included in the pixel circuit layer PCL. Accordingly, the second sub-electrode SELT2 may be closer to the substrate SUB compared to the second electrode ELT2. The first sub-electrode SELT1 may be spaced apart from the light emitting element LD compared to the first electrode ELT1.

According to an embodiment, the sub-electrode SELT may have a shape protruding from the alignment electrode ELT in a plan view. For example, the sub-electrode SELT may include a base part 2220 and a protrusion 2240.

A portion of the sub-electrode SELT may overlap the alignment electrode ELT in a plan view, and another portion of the sub-electrode SELT may not overlap the alignment electrode ELT in a plan view.

According to an embodiment, the sub-electrode SELT may not overlap the light emitting element LD in a plan view. For example, the light emitting element LD may be disposed between the first sub-electrode SELT1 and the second sub-electrode SELT2.

The base part 2220 may be a portion of the sub-electrode SELT, and may be a base area connected to protrusions 2240. For example, one of the protrusions 2240 may be connected to one area or an area of the base part 2220, and another of the protrusions 2240 may be connected to another area of the base part 2220. The base part 2220 may overlap the alignment electrode ELT in a plan view. For example, the base part 2220 of the first sub-electrode SELT1 may overlap the first electrode ELT1 in a plan view, and the base part 2220 of the second sub-electrode SELT2 may overlap the second electrode ELT2 in a plan view.

The protrusion 2240 may refer to a portion of the sub-electrode SELT protruding from the base part 2220. The protrusion 2240 may have a protruding shape in a plan view. The protrusion 2240 may have a shape protruding toward a corresponding light emitting element LD in a plan view.

For example, protrusions 2240 may be provided to be respectively connected to the base part 2220. The protrusion 2240 may not overlap the alignment electrode ELT in a plan view. For example, the protrusion 2240 of the first sub-electrode SELT1 may not overlap the first electrode ELT1 in a plan view, and the protrusion 2240 of the second sub-electrode SELT2 may not overlap the second electrode ELT2 in a plan view.

According to an embodiment, the protrusion 2240 may not overlap the light emitting element LD in a plan view. For example, each of the light emitting elements LD may be disposed between the corresponding protrusions 2240.

According to an embodiment, the light emitting element LD may be disposed between the corresponding protrusions 2240 in a plan view. According to an embodiment, the light emitting element LD may not overlap the corresponding protrusion 2240 in a plan view. However, the disclosure is not limited to the above-described example. According to an embodiment, a portion of the light emitting element LD may overlap the protrusion 2240 in a plan view.

The protrusion 2240 of the first sub-electrode SELT1 may have a shape protruding from the first end EP1 of the light emitting element LD toward the second end EP2 (for example, the first direction DR1). The protrusion 2240 of the second sub-electrode SELT2 may have a shape protruding from the second end EP2 of the light emitting element LD toward the first end EP1 (for example, refer to FIG. 11). For example, the protrusion 2240 may have a shape protruding from the first semiconductor layer SCL1 of the light emitting element LD toward the second semiconductor layer SCL2. According to an embodiment, the protrusion 2240 may have a shape that substantially protrudes in the direction in which the light emitting element LD extends.

A position of the protrusion 2240 of the first sub-electrode SLET1 and a position of the protrusion 2240 of the second sub-electrode SELT2 may correspond to each other, and may form a pair. According to an embodiment, the light emitting element LD may be disposed on the pair of protrusions 2240. For example, 6 pairs of protrusions 2240 are shown in FIG. 11, and the light emitting elements LDs are disposed to correspond to each of pairs. According to an embodiment, the number of light emitting elements LD formed to normally operate (for example, emit light) may be at least greater than or equal to the number of pairs of protrusions 2240 in the sub-pixel SPXL. According to an embodiment, the number of normally aligned light emitting elements LD may be at least greater than or equal to the number of pairs of protrusions 2240 in the sub-pixel SPXL. Here, the normal alignment of the light emitting element LD may mean a disposition state in which the first end EP1 of the light emitting element LD faces the first electrode ELT1 and the second end EP2 of the light emitting element LD faces the second electrode ELT2.

The protrusion 2240 may be generally dispersedly disposed on one side or a side of the base part 2220. For example, protrusions 2240 may be provided, and may be disposed to be spaced apart from each other in a regular distance on one side or a side of the base part 2220.

According to an embodiment, the light emitting elements LD may be aligned according to the electric field formed based on the electrical signals provided to the alignment electrode ELT and the sub-electrode SELT including the protrusion 2240. For example, the light emitting elements LD may be aligned based on the electric field formed by the sub-electrode SELT, and may be aligned based on the electric field formed by the alignment electrode ELT. However, the disclosure is not necessarily limited to the above-described example. For example, the light emitting elements LD may be aligned based on an electric field simultaneously formed by the sub-electrode SELT and the alignment electrode ELT. By way of example, the light emitting elements LD may be aligned based on the electric field formed by the alignment electrode ELT, and may be aligned based on the electric field formed by the sub-electrode SELT.

At this time, a distance between the pairs of protrusions 2240 may be less than a distance in an area where the protrusion 2240 is not disposed, and thus a relatively strong electric field may be formed in an area where the protrusion 2240 is disposed. The light emitting elements LD tend to be disposed in the area where the protrusion 2240 is disposed. For example, an area where the light emitting element LD is to be disposed may correspond to the area where the protrusion 2240 is disposed, and a user may appropriately control a position where the light emitting element LD is disposed by adjusting a position of the protrusion 2240.

An area in which a process is performed may be sufficiently secured by forming the sub-electrode SELT on a layer different from a layer on which the alignment electrode ELT is disposed (for example, a layer of the pixel circuit layer PCL).

The electric field formed by the alignment electrode ELT and the electric field formed by the sub-electrode SELT may be independently controlled (for example, formed sequentially or simultaneously), and thus an alignment state of the light emitting element LD may be appropriately controlled.

The sub-electrode SELT may be provided as a same layer as one of the conductive layers disposed in the pixel circuit layer PCL, and thus a separate additional process may not be required, thereby providing an effect in which process cost is reduced.

According to an embodiment, the protrusions 2240 connected to (or formed integrally with or integral with) a same base part 2220 and adjacent to each other may be spaced apart from each other by a first separation distance 1200 along one direction or a direction. For example, the protrusions 2240 adjacent to each other along the second direction DR2 may be spaced apart from each other by a first separation distance 1200. According to an embodiment, the first separation distance 1200 may mean a shortest distance between adjacent protrusions 2240. According to an embodiment, the protrusion 2240 of the first sub-electrode SELT1 may be spaced apart from the most adjacent protrusion 2240 among the protrusions 2240 of the second sub-electrode SELT2, which do not form a pair by a second separation distance 1400. For example, the second separation distance 1400 may mean a shortest distance in a diagonal direction (for example, a direction between the first direction DR1 and the second direction DR2) between the protrusion 2240 of the first sub-electrode SELT1 and the protrusion 2240 of the second sub-electrode SELT2.

According to an embodiment, the first separation distance 1200 may be greater than the length L of the light emitting element LD. According to an embodiment, the second separation distance 1400 may be greater than the length L of the light emitting element LD. The light emitting element LD may tend to be disposed between the protrusions 2240 that are paired with each other (for example, adjacent in the first direction DR1) without being disposed between the protrusions 2240 adjacent to each other in a diagonal direction. Accordingly, an alignment degree of the light emitting elements LD may be improved, and the number of normally aligned light emitting elements LD may be increased, thereby improving light output efficiency of the display device DD.

A structure of the protrusion 2240 according to an embodiment is not necessarily limited to a specific example. For example, it is sufficient in case that the protrusion 2240 generally has a shape protruding in one direction or a direction, and a given shape may be variously changed. This is described with reference to FIGS. 13, 15, and 16.

Figure 15:
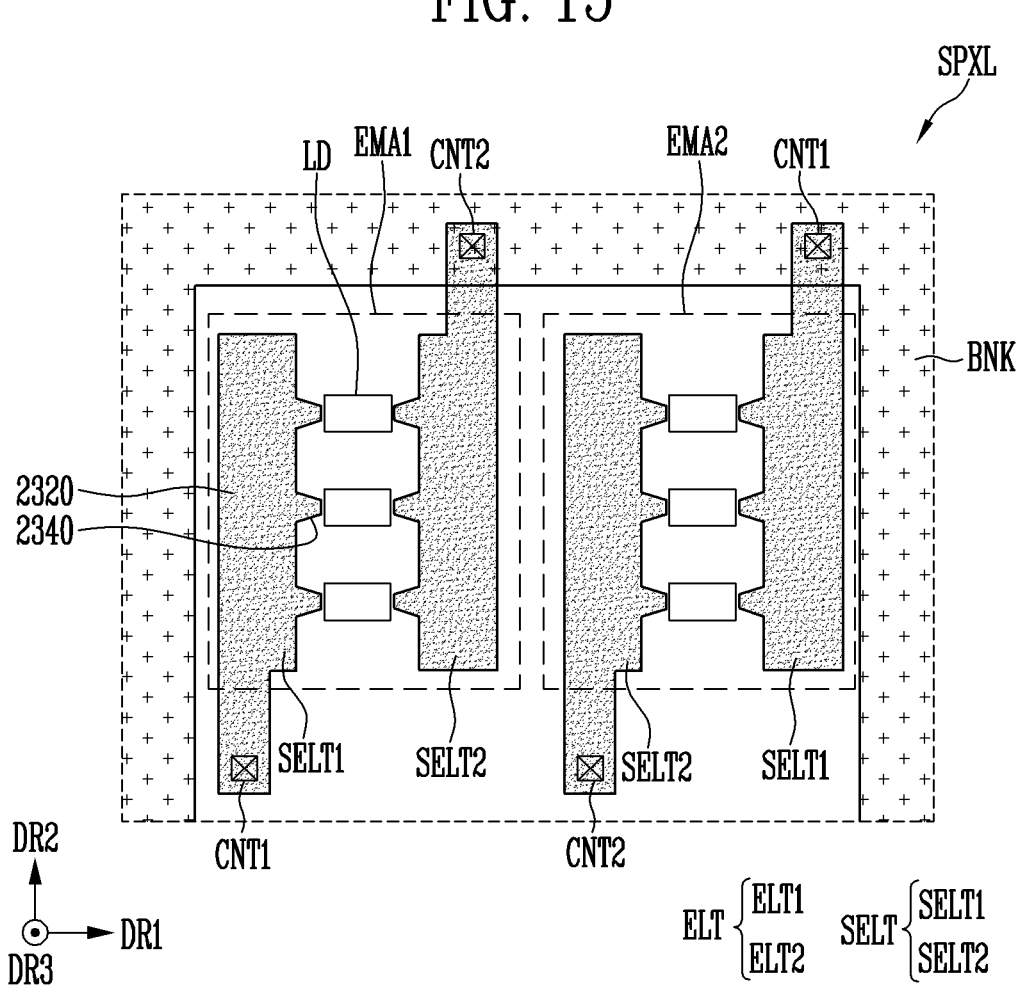
FIGS. 15 and 16 are schematic plan views illustrating a sub-pixel according to an embodiment, and are views illustrating a modified embodiment.
Figure 16:
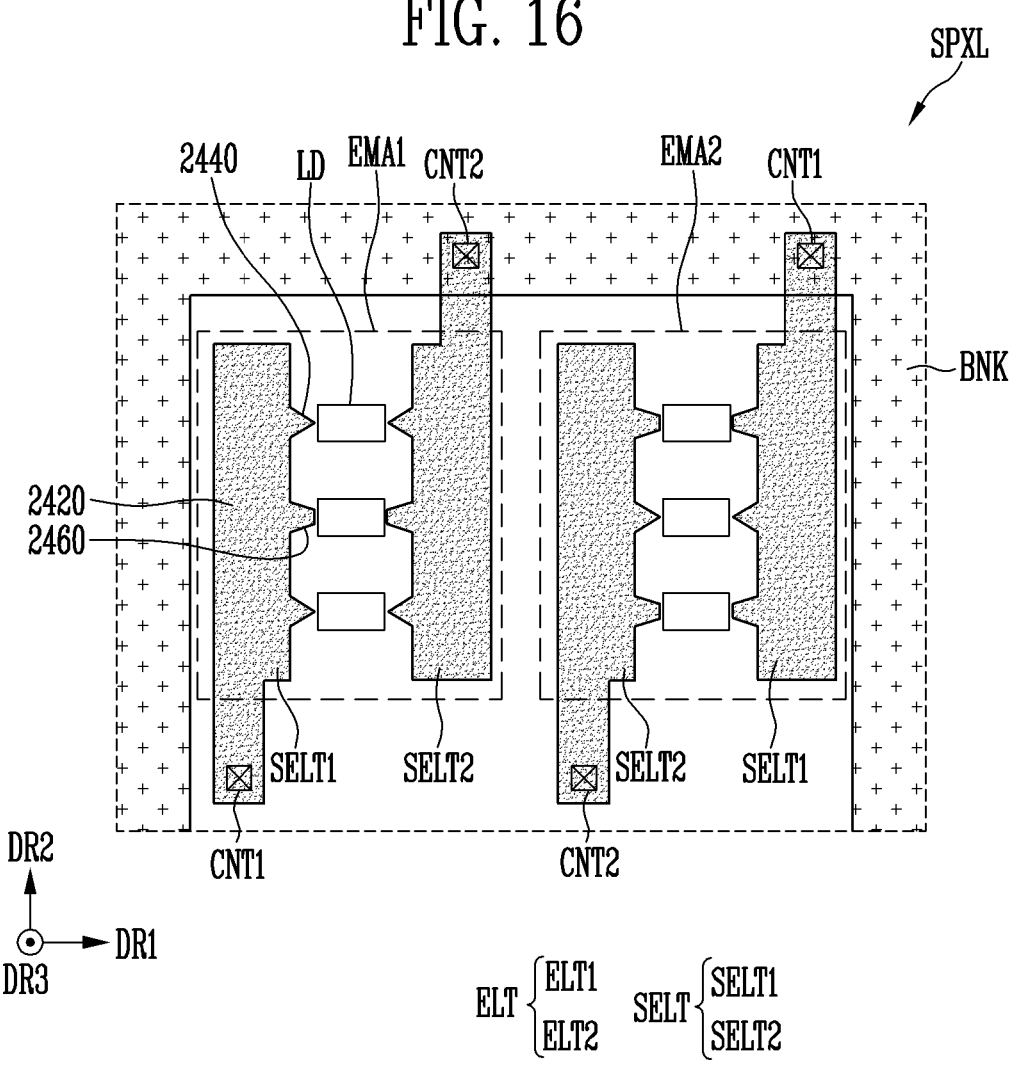

FIGS. 15 and 16 are schematic plan views illustrating a sub-pixel according to an embodiment, and are views illustrating a modified embodiment.

Referring to FIG. 13, a protrusion 2240 according to a first embodiment may have a shape in which an end sharply protrudes. For example, the protrusion 2240 may have a triangular shape in which one surface or a surface is connected to the base part 2220.

Referring to FIG. 15, a protrusion 2340 according to a second embodiment may have a flat end. For example, the protrusion 2340 may have a trapezoidal shape in which one surface or a surface is connected to the base part 2320 and another surface or the other surface is adjacent to another protrusion 2340.

Referring to FIG. 16, protrusions 2440 and 2460 according to a third embodiment may have different shapes. The protrusions 2440 and 2460 according to the third embodiment may have a shape protruding from the base part 2420. For example, a portion of the protrusions 2440 and 2460 according to the third embodiment may have a triangular shape (for example, '2440'), and another portion may have a trapezoidal shape (for example, '2460').

Hereinafter, a structure of the sub-pixel SPXL according to an embodiment is described with reference to FIG. 17. Contents that may overlap the above-described content is simplified or is not repeated.

Figure 17:
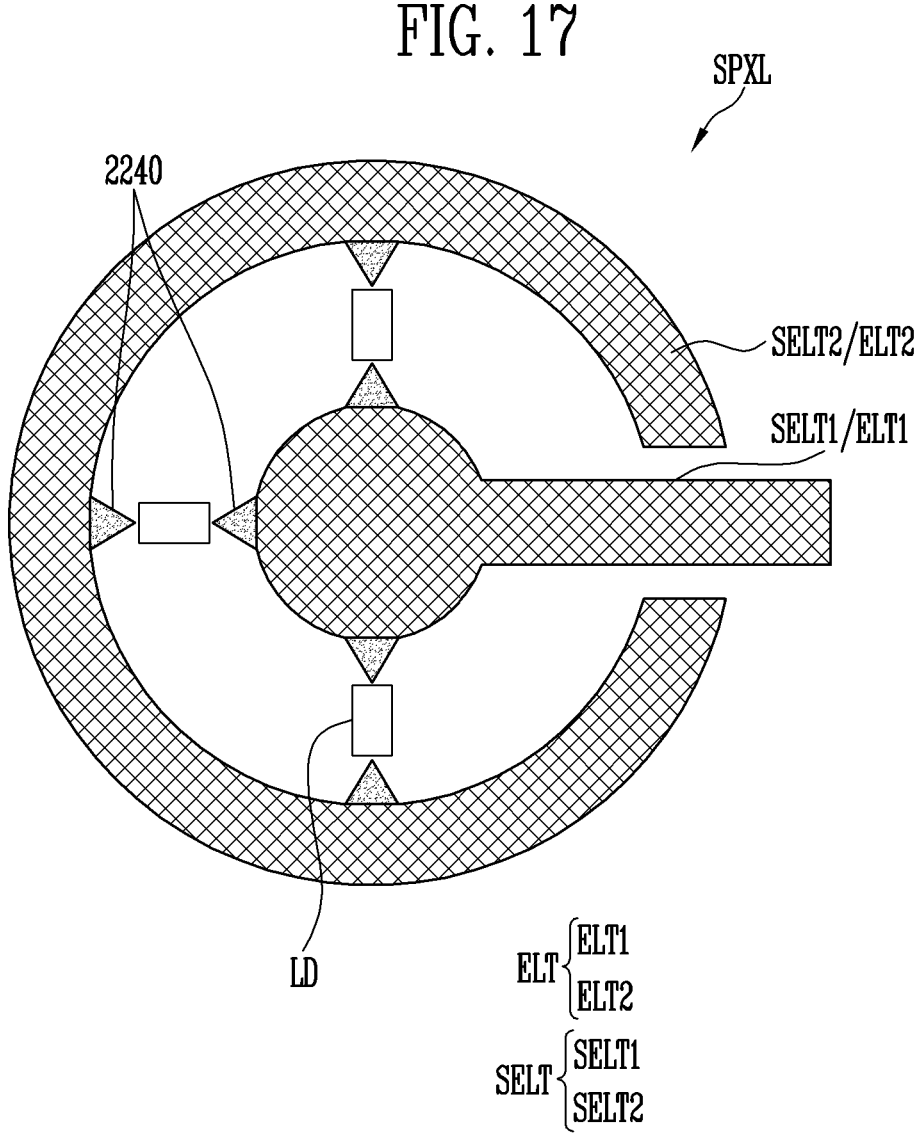
FIG. 17 is a schematic plan view illustrating a sub-pixel according to an embodiment.

FIG. 17 is a schematic plan view illustrating a sub-pixel according to an embodiment. In FIG. 17, for convenience of description, the alignment electrode ELT, the sub-electrode SELT, and the light emitting element LD are shown.

Referring to FIG. 17, a path in which the light emitting elements LD are aligned may have a circular shape. For example, the light emitting elements LD may be aligned between the first electrode ELT1 and the second electrode ELT2, and a shape of the path in which the light emitting elements LD are disposed may correspond to a shape of the first electrode ELT1 and the second electrode ELT2.

According to an embodiment, the first electrode ELT1 and the second electrode ELT2 may be spaced apart from each other with a curve path interposed therebetween. Similarly, the first sub-electrode SELT1 and the second sub-electrode SELT2 may be spaced apart from each other with a curve path interposed therebetween.

Accordingly, the light emitting elements LD may be disposed on a path defined in a curve shape. As described above, since the protrusion 2240 is provided, it goes without saying that an alignment position of the light emitting element LD may be readily controlled.

Hereinafter, a method of manufacturing the display device DD according to an embodiment is described with reference to FIGS. 18 to 26. Contents that may overlap the above-described contents is simplified or is not repeated.

Figure 18:
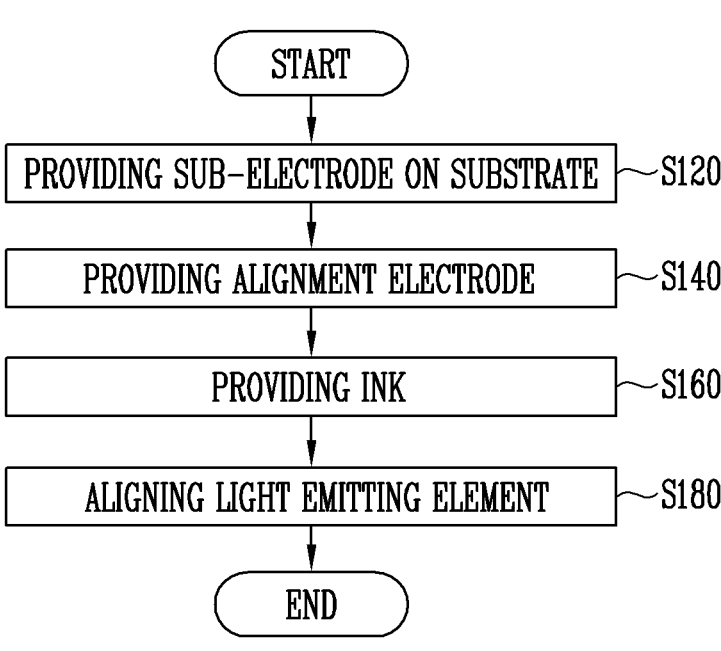
FIG. 18 is a flowchart illustrating a method of manufacturing a display device according to an embodiment.

FIG. 18 is a flowchart illustrating a method of manufacturing a display device according to an embodiment.

FIGS. 19, 21, 23, and 25 are schematic cross-sectional views for each process step schematically illustrating a method of manufacturing a display device according to an embodiment. FIGS. 19, 21, 23, and 25 may illustrate based on the cross-sectional structure described above with reference to FIG. 9. In FIGS. 19, 21, 23, and 25, for convenience of description, the layers disposed between the protective layer PSV and the substrate SUB in the pixel circuit layer PCL are collectively described as a lower layer 100.

FIGS. 20, 22, 24, and 26 are plan views for each process step schematically illustrating a method of manufacturing a display device according to an embodiment. FIGS. 20, 22, 24, and 26 may illustrate based on the planar structure described above with reference to FIG. 12. In FIGS. 20, 22, 24, and 26, the end of the protrusion 2240 is shown based on a sharply protruding shape.

Referring to FIG. 18, the method of manufacturing the display device DD according to an embodiment may include providing a sub-electrode on a substrate (S120), providing an alignment electrode (S140), providing an ink (S160), and aligning a light emitting element (S180).

Figure 19:
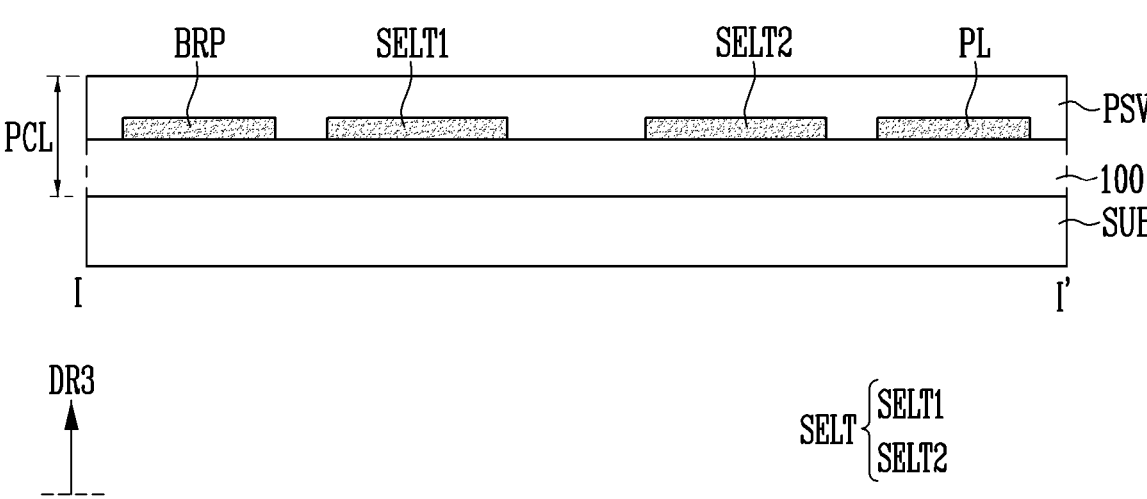
FIGS. 19, 21, 23, and 25 are schematic cross-sectional views for each process step schematically illustrating a method of manufacturing a display device according to an embodiment.
Figure 20:
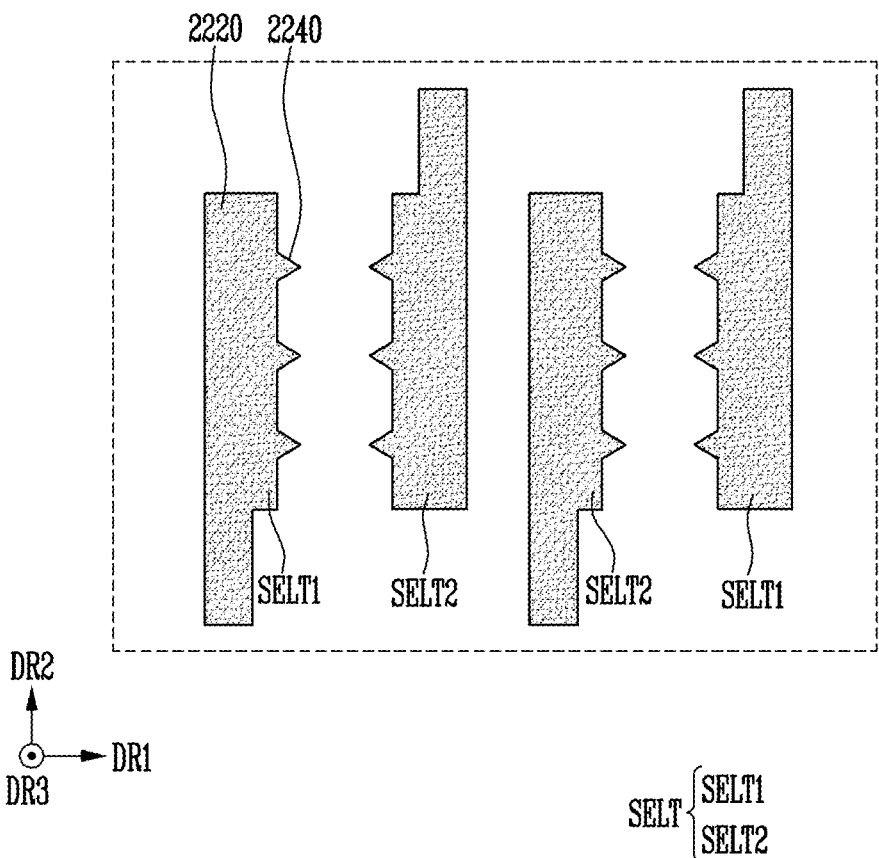
FIGS. 20, 22, 24, and 26 are schematic plan views for each process step schematically illustrating a method of manufacturing a display device according to an embodiment.

Referring to FIGS. 18 to 20, in providing the sub-electrode on the substrate (S120), the lower layer 100 may be disposed on the substrate SUB and the sub-electrode SELT may be disposed on the lower layer 100. The protective layer PSV may be formed to cover the sub-electrode SELT. According to an embodiment, the bridge pattern BRP and the power line PL may be disposed on the lower layer 100.

In the present phase, individual configurations (for example, configurations included in the pixel circuit layer PCL) of the lower layer 100 disposed on the substrate SUB may be formed by patterning a conductive layer (or a metal layer), an inorganic material, an organic material, or the like by performing a process using a mask.

In the present phase, the sub-electrode SELT may be formed on the lower layer 100 and applied by the protective layer PSV. A portion of the sub-electrode SELT may be disposed so as not to overlap an area in which the alignment electrode ELT is to be disposed later in a plan view. For example, the sub-electrode SELT may include the protrusion 2240 connected to the base part 2220 and protruding in one direction or a direction.

According to an embodiment, the sub-electrode SELT may be disposed on a same layer as one of the lower sub-electrode BML, the gate electrode GE, and the first and second transistor electrodes TE1 and TE2 disposed in the lower layer 100.

Figure 21:
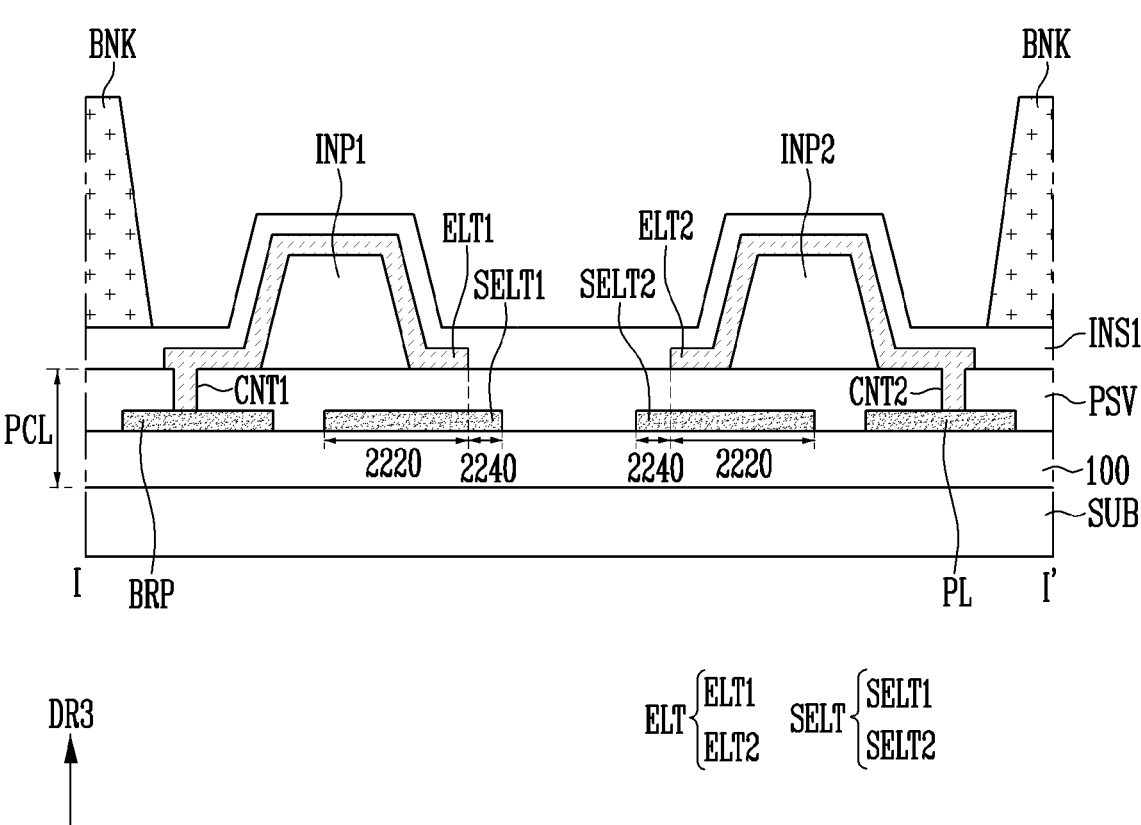
Figure 22:
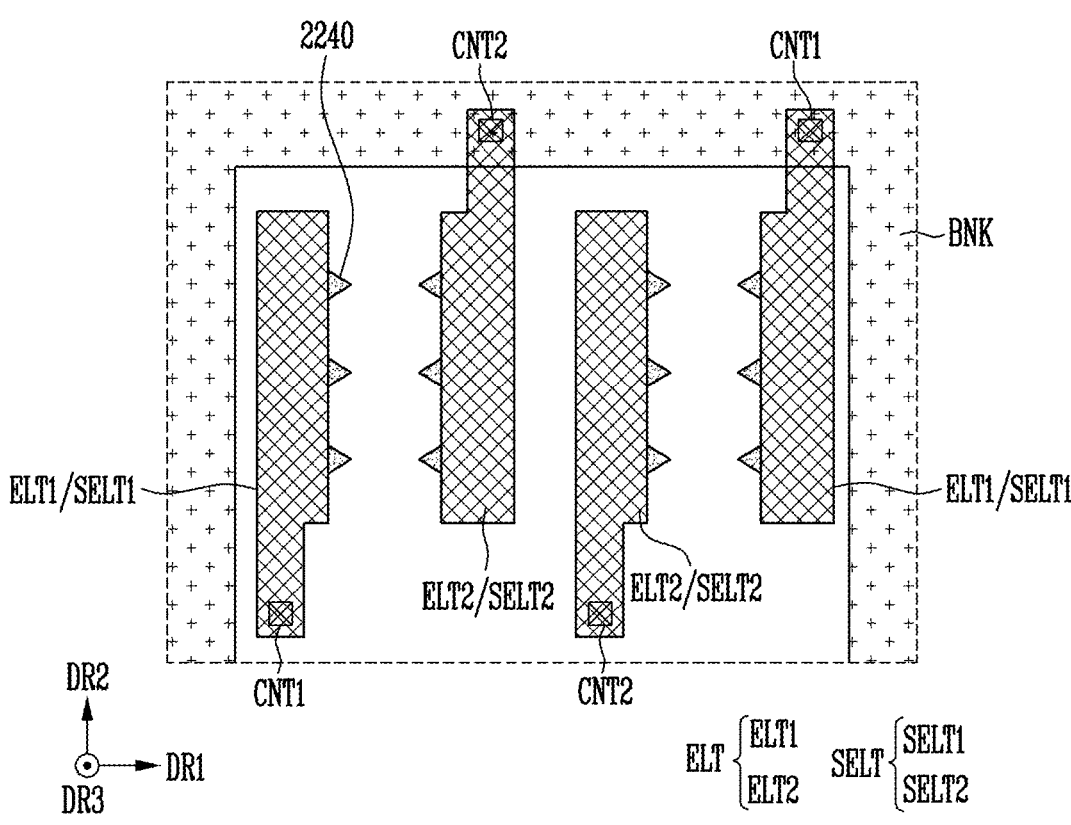

Referring to FIGS. 18, 21, and 22, in providing the alignment electrode (S140), the first insulating pattern INP1 and the second insulating pattern INP2 may be formed on the protective layer PSV, and the alignment electrode ELT may be formed (or deposited). The first insulating layer INS1 may be formed on the alignment electrode ELT, and the bank BNK may be formed on the first insulating layer INS1.

In the present phase, although not separately shown in the drawing, after the base electrode is deposited on the protective layer PSV, at least a portion of the base electrode may be etched to pattern the first electrode ELT1 and the second electrode ELT2. Before depositing the base electrode, holes for forming the first contact portion CNT1 and the second contact portion CNT2 may be formed in the protective layer PSV, and the base electrode may be deposited. Accordingly, the first contact portion CNT1 electrically connected to the first electrode ELT1 and the second contact portion CNT2 electrically connected to the second electrode ELT2 may be provided, the first electrode ELT1 may be electrically connected to the bridge pattern BRP through the first contact portion CNT1, and the second electrode ELT2 may be electrically connected to the power line PL.

In the present phase, each of the first electrode ELT1 and the second electrode ELT2 may be formed to cover the first insulating pattern INP1 and the second insulating pattern INP2. Accordingly, in the present phase, at least a portion of the first electrode ELT1 and the second electrode ELT2 may be provided as a reflective partition wall.

In the present phase, the first electrode ELT1 and the second electrode ELT2 may be patterned to overlap the sub-electrode SELT (for example, the base part 2220) in a plan view. For example, the first electrode ELT1 may be patterned to overlap the base part 2220 of the first sub-electrode SELT1, and the second electrode ELT2 may be patterned to overlap the base part 2220 of the second sub-electrode SELT2. However, the first electrode ELT1 and the second electrode ELT2 may be patterned so as not to overlap the protrusion 2240 of the sub-electrode SELT.

According to an embodiment, the bank BNK may define a space in which a fluid may be accommodated. For example, in FIG. 21, a fluid may be accommodated between the bank BNK disposed on one side or a side and the bank BNK disposed on another side or the other side. As described above, the bank BNK may include a reflective material to form the reflective partition wall.

Figure 23:
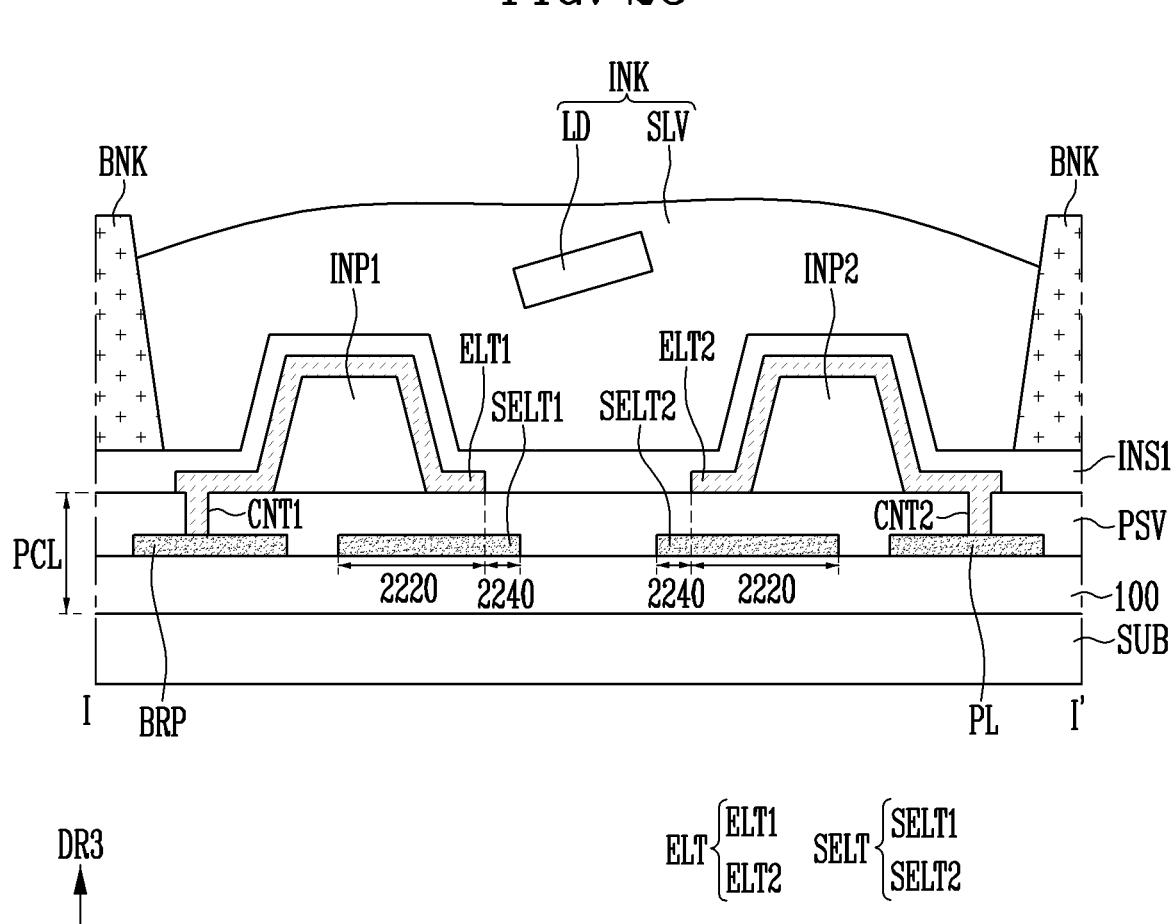
Figure 24:
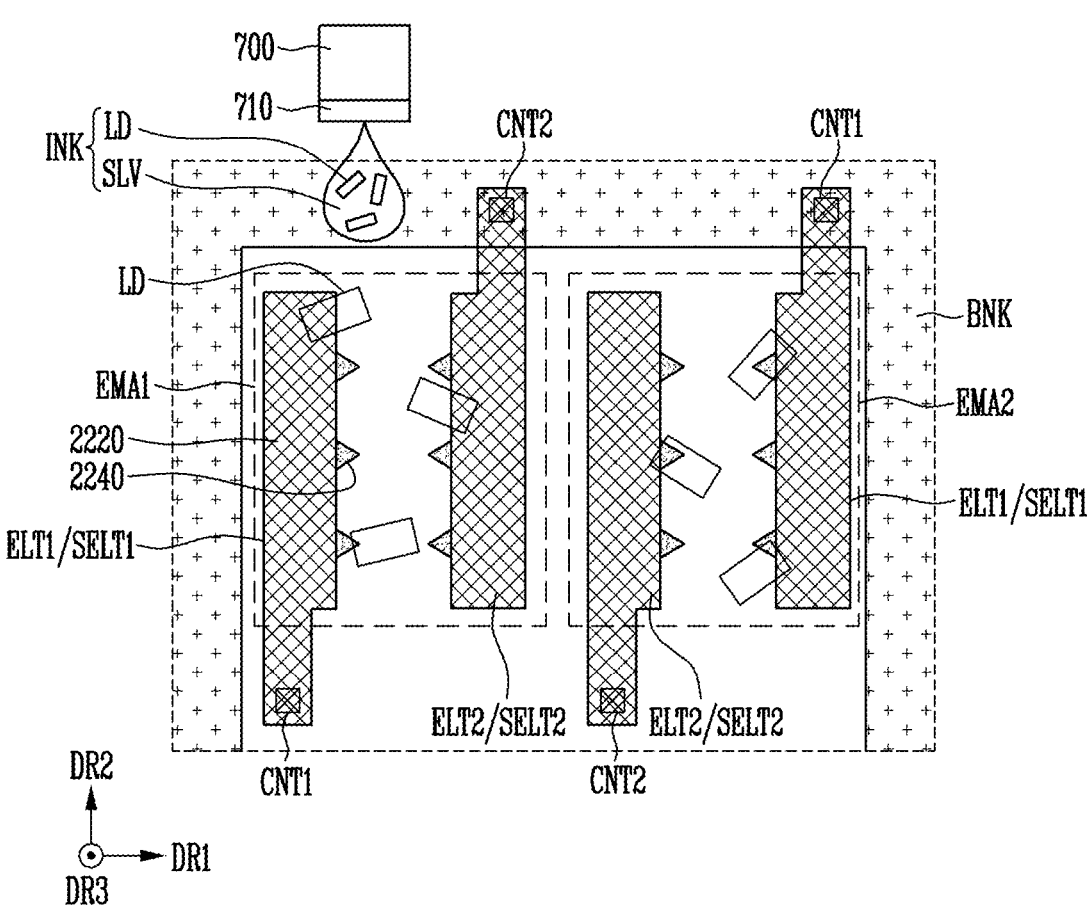

Referring to FIGS. 18, 23, and 24, in providing the ink (S160), the ink INK may be supplied (or sprayed) on the substrate SUB. The ink INK may be provided by a printing device 700 capable of spraying a fluid.

According to an embodiment, the printing device 700 may include a nozzle device 710 to discharge a liquid fluid to the outside. The ink INK as defined herein may refer to a liquid mixture that may be discharged by the printing device 700.

In the present phase, the printing device 700 may spray the ink INK while moving along the first direction DR1 and the second direction DR2 to the area where the light emitting elements LD are to be arranged.

According to an embodiment, the ink INK may include a solvent SLV and the light emitting element LD. Light emitting elements LD may be provided, may be dispersed in the solvent SLV having a fluid property, and may be provided. For example, according to an embodiment, the solvent SLV may have a fluid property, and thus the light emitting element LD may be dispersed in the solvent SLV. The solvent SLV may refer to a fluid material, not a solid phase, in which the light emitting element LD is dispersedly and prepared. According to an embodiment, the solvent SLV may include an organic solvent. For example, the solvent SLV may be one of propylene glycol methyl ether acetate (PGMEA), dipropylen glycol n-propyl ether (DGPE), and triethylene gylcol n-butyl ether (TGBE). However, the disclosure is not limited to the above-described example, and the solvent SLV may include various organic solvents.

In the present phase, the ink INK may be accommodated in the space defined by the bank BNK. The light emitting element LD included in the ink INK may be provided in a state in which the light emitting element LD is randomly positioned in the space.

Figure 25:
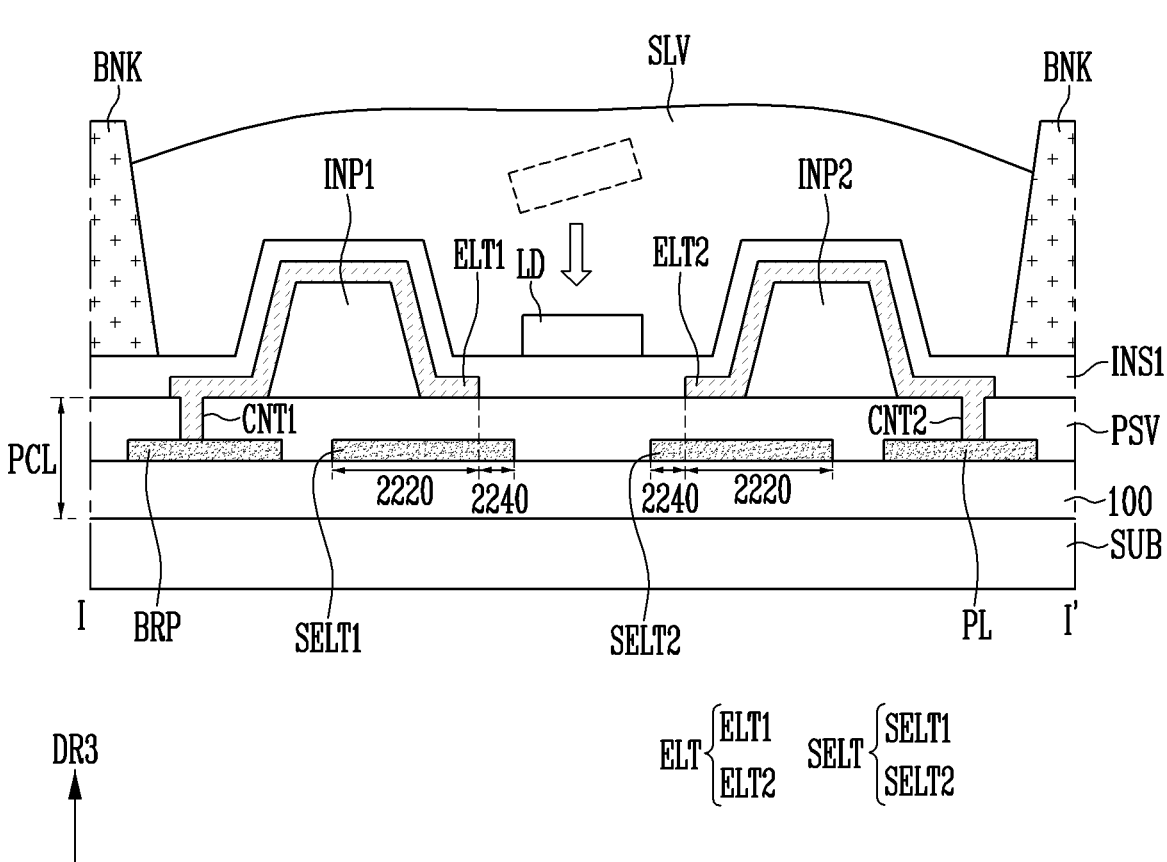
Figure 26:
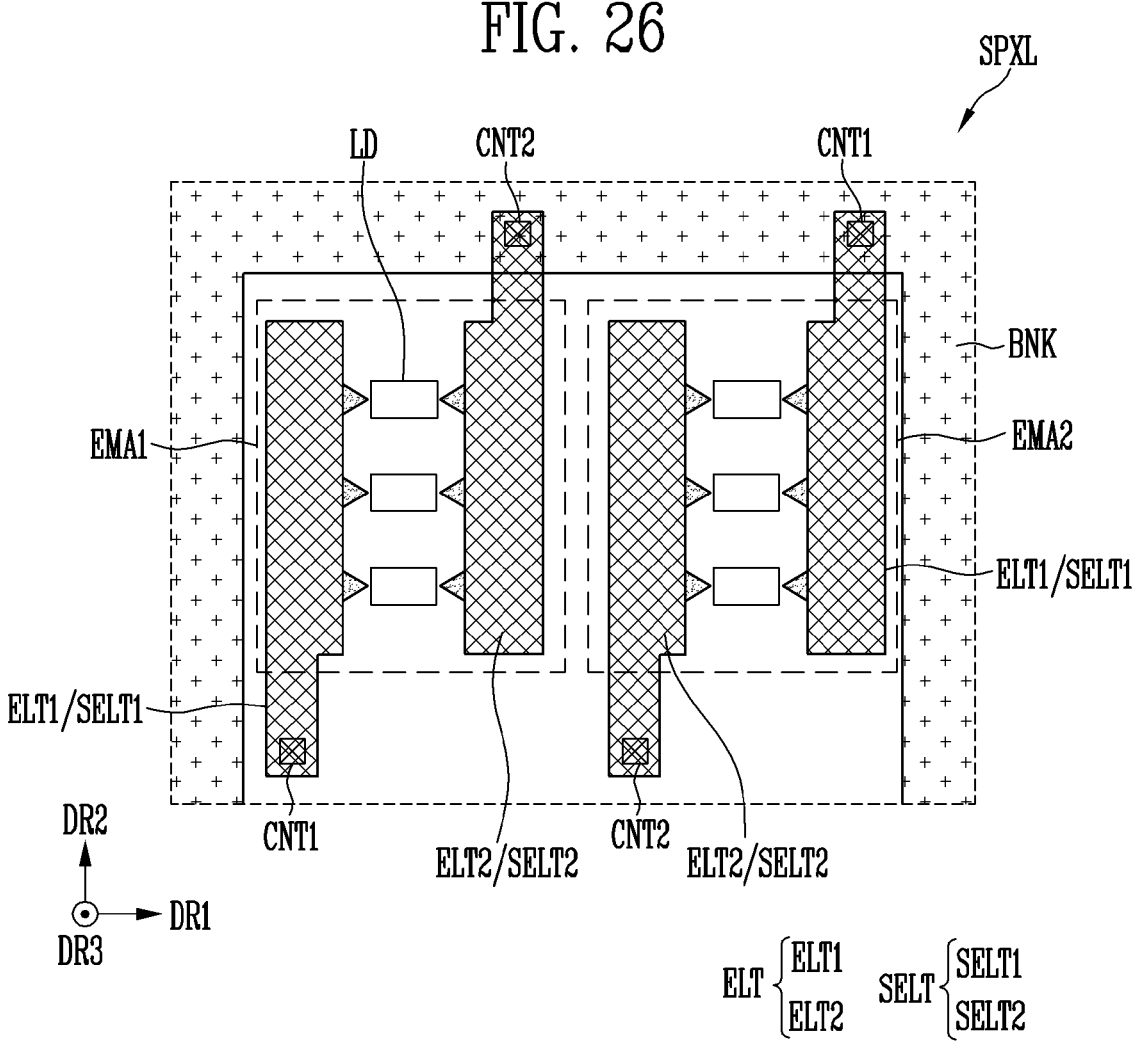

Referring to FIGS. 18, 25, and 26, in aligning the light emitting elements (S180), the light emitting elements LD may be aligned (or disposed) on the substrate SUB.

In the present phase, the light emitting elements LD may be disposed on the alignment electrode ELT. The light emitting elements LD may be disposed on the first electrode ELT1 and the second electrode ELT2.

In the present phase, the light emitting element LD may be disposed so as not to overlap the protrusion 2240 between the first sub-electrode SELT1 and the second sub-electrode SELT2 in a plan view.

In the present phase, the sub-electrode SELT may form the electric field. The electric signal (for example, the alignment signal) may be provided to the sub-electrode SELT, and thus the electric field may be formed in the area where the light emitting element LD is to be aligned. For example, the first alignment signal may be provided to the first sub-electrode SELT1, the second alignment signal may be provided to the second sub-electrode SELT2, and the electric field based on the first alignment signal and the second alignment signal may be formed in the area where the light emitting element LD is to be aligned.

In the present phase, the alignment electrode ELT may form the electric field. The electric signal (for example, the alignment signal) may be provided to the alignment electrode ELT, and thus the electric field may be formed in the area where the light emitting element LD is to be aligned. For example, the first alignment signal may be provided to the first electrode ELT1, the second alignment signal may be provided to the second electrode ELT2, and the electric field based on the alignment signal and the second alignment signal may be formed in the area where the light emitting element LD is to be aligned.

According to an embodiment, the light emitting elements LD may be moved (or rotated) by force (for example, dielectrophoresis (DEP) force) according to the electric field, and may be aligned (or disposed) on the first insulating layer INS1. For example, the moved light emitting elements LD may be aligned on the alignment electrode ELT.

According to an embodiment, the electrical signal (for example, the alignment signal) provided to the sub-electrode SELT and the alignment electrode ELT may include an alternating current (AC) signal. For example, the first alignment signal may be an AC signal, and the second alignment signal may be a ground signal. However, the disclosure is not necessarily limited to the above-described example.

The AC signal may be any one of a sine wave, a triangular wave, a step wave, a quadrangular wave, a trapezoidal wave, and a pulse wave, but is not limited thereto, and may have various AC signal shapes.

According to an embodiment, an operation of forming the electric field by the alignment electrode ELT and an operation of forming the electric field by the sub-electrode SELT may be independently controlled. For example, as described above, the sub-electrode SELT may form the electric field to move (or rotate) the light emitting element LD, and the alignment electrode ELT may form the electric field to move (or rotate) the light emitting element LD. By way of example, the alignment electrode ELT may form the electric field to move (or rotate) the light emitting element LD, and the sub-electrode SELT may form the electric field to move (or rotate) the light emitting element LD. By way of example, the sub-electrode SELT and the alignment electrode ELT may simultaneously form the electric field in at least a partial time period to move (or rotate) the light emitting element LD.

As an example, an embodiment in which the sub-electrode SELT forms the electric field and the alignment electrode ELT forms the electric field is described. Those skilled in the art will clearly understand that the disclosure is not necessarily limited to the embodiment to be described later. Here, an embodiment may include a case in which the alignment electrode ELT starts to form the electric field after a time point at which the sub-electrode SELT starts to form the electric field.

First, the sub-electrode SELT may form a first electric field. At this time, the light emitting element LD may be disposed in an area where the light emitting element LD is to be spatially arranged. For example, since a strong electric field is formed in the area where the pair of protrusions 2240 is formed, the light emitting elements LD may be predominantly disposed in the area where the pair of protrusions 2240 are formed.

The alignment electrode ELT may form a second electric field. At this time, the light emitting element LD may be rotated to be normally oriented in the area where the light emitting element LD is to be arranged. A pose of the light emitting element LD may be changed based on the second electric field. For example, based on the second electric field, the first end EP1 of the light emitting element LD may face the first sub-electrode SELT1 (or the first electrode ELT1), and the second end EP2 may face the second sub-electrode SELT2 (or the second electrode ELT2).

Accordingly, according to an embodiment, the light emitting elements LD may be appropriately arranged at a desired position, and may be biasedly arranged sufficiently, thereby improving light emission efficiency of the light emitting elements. Finally, according to an embodiment, a process may be improved, and light output efficiency of the display device DD may be improved.

In the present phase, as electrodes to which a same alignment signal (for example, the cathode signal, or the ground signal) is provided, the second electrode ELT2 and the second sub-electrode SELT2 disposed in the first emission area EMA1 and the second electrode ELT2 and the second sub-electrode SELT2 disposed in the second emission area EMA2 may be adjacent to each other. Accordingly, the light emitting elements LD may be prevented from being abnormally aligned between the first emission area EMA1 and the second emission area EMA2.

An intensity of the electric field formed in the area where the protrusion 2240 is disposed may be greater than an intensity of the electric field formed in the area where the protrusion 2240 is not disposed. Accordingly, a tendency of the light emitting element LD to be aligned in the area where the protrusion 2240 is disposed may be greater than a tendency of the light emitting element LD to be aligned in the area where the protrusion 2240 is not disposed.

According to an embodiment, the light emitting elements LD may be disposed to correspond to the position of the protrusion 2240 of the sub-electrodes SELT. The protrusion 2240 of the first sub-electrode SELT1 and the protrusion 2240 of the second sub-electrode SELT2 may be disposed side by side in one direction or direction (for example, a direction in which the first electrode ELT1 and the second electrode ELT2 are spaced apart, and the first direction DR1) to form a pair, and each of the light emitting elements LD may be disposed to correspond to the pair of protrusions 2240.

According to an embodiment, as described above, the number of normally aligned light emitting elements LD may be greater than or equal to the number of pairs of protrusions 2240 of the sub-electrode SELT. For example, according to an embodiment, a minimum amount of the light emitting elements LD that are normally aligned may be secured, and thus reliability of the process may be further improved.

According to an embodiment, the protrusions 2240 may be disposed adjacent to the sub-electrode SELT and the alignment electrode ELT and may be dispersedly disposed over the entire path area in which the light emitting element LD is disposed. Each of the light emitting elements LD may have a tendency to be disposed adjacent to the protrusion 2240, and thus the light emitting elements LD may be prevented from being locally aligned.

Thereafter, although not shown in a separate drawing, the solvent SLV may be removed. The second insulating layer INS2, the first contact electrode CNE1, the second contact electrode CNE2, the third insulating layer INS3, and the fourth insulating layer INS4 may be provided on the light emitting element LD, and thus the display element layer DPL according to an embodiment may be provided. The color conversion unit CCL may be provided, the optical layer OPL, the color filter layer CFL, and the outer film layer UFL may be disposed on the color conversion unit CCL, and thus the display device DD according to an embodiment may be provided.

Although the disclosure has been described with reference to embodiments, those skilled in the art or those having a common knowledge in the art will understand that the disclosure may be variously modified and changed without departing from the spirit and technical area of the disclosure and as described in the claims which will be described later.

Therefore, the technical scope of the disclosure should not be limited to the contents described in the detailed description of the specification, but should also be defined by the claims.

What is claimed is:

1. A display device comprising:
an alignment electrode disposed on a substrate and including a first electrode and a second electrode spaced apart from each other;
a light emitting element disposed on the first electrode and the second electrode; and
a sub-electrode disposed on the substrate and including a first sub-electrode and a second sub-electrode spaced apart from each other, wherein
the sub-electrode includes a base part and a protrusion protruding from the base part in a plan view.

2. The display device according to claim 1, wherein the light emitting element includes:
a first semiconductor layer;
a second semiconductor layer; and
an active layer disposed between the first semiconductor layer and the second semiconductor layer,
a protrusion of the first sub-electrode protrudes from the first semiconductor layer toward the second semiconductor layer, and
a protrusion of the second sub-electrode protrudes from the second semiconductor layer toward the first semiconductor layer.

3. The display device according to claim 1, further comprising:
a lower sub-electrode disposed on the substrate;
a transistor electrically connected to the light emitting element and including a first transistor electrode, a second transistor electrode, and a gate electrode;
a protective layer disposed on the transistor; and
a bridge pattern disposed on the protective layer, and
the sub-electrode and one of the lower sub-electrode, the gate electrode, the first transistor electrode, the second transistor electrode, and the bridge pattern are disposed on a same layer.

4. The display device according to claim 1, wherein the protrusion has a triangular shape including a surface connected to the base part.

5. The display device according to claim 1, wherein the protrusion has a trapezoidal shape including a surface connected to the base part.

6. The display device according to claim 1, wherein a portion of the protrusion has a triangular shape including a surface connected to the base part, and another portion of the protrusion has a trapezoidal shape including a surface connected to the base part.

7. The display device according to claim 1, wherein a portion of the sub-electrode does not overlap the alignment electrode in a plan view.

8. The display device according to claim 1, wherein
the base part overlaps the alignment electrode in a plan view, and
the protrusion does not overlap the alignment electrode in a plan view.

9. The display device according to claim 1, wherein
the first electrode and the first sub-electrode overlap in a plan view,
the second electrode and the second sub-electrode overlap in a plan view, and
the light emitting element is disposed in a path having a circular shape between the first electrode and the second electrode in a plan view.

10. The display device according to claim 1, wherein
a position of the protrusion of the first sub-electrode and a position of the protrusion of the second sub-electrode correspond to each other and form a pair, and
the light emitting element corresponds to the pair of protrusions.

11. The display device according to claim 10, wherein the protrusion is spaced apart from a side of the base part.

12. The display device according to claim 1, further comprising:
a bank having a shape protruding in a thickness direction of the substrate;
an emission area including the light emitting element and does not overlap the bank in a plan view; and
a non-emission area not including the light emitting element,
the first electrode and the second electrode are spaced apart from each other in a first direction,
the non-emission area includes an area that does not overlap the bank in a plan view, and
the area that does not overlap the bank is disposed between adjacent emission areas in a second direction different from the first direction.

13. The display device according to claim 12, wherein
the alignment electrode has a first width in the emission area and a second width in the area that does not overlap the bank, and
the first width is greater than the second width.

14. The display device according to claim 12, wherein
the emission area includes a first emission area and a second emission area adjacent to each other in the first direction, and
an electrode most adjacent to the second emission area among alignment electrodes in the first emission area and an electrode most adjacent to the first emission area among alignment electrodes in the second emission area provide a cathode signal.

15. The display device according to claim 1, further comprising:

a bank disposed on the substrate and protruding in a thickness direction of the substrate, wherein
the light emitting element is disposed between banks, and
the bank includes a reflective material.

16. A display device comprising:
an alignment electrode disposed on a substrate;
a light emitting element in an emission area disposed on the substrate; and
a sub-electrode disposed on the substrate, wherein
the sub-electrode includes a protrusion protruding toward the light emitting element,
the emission area includes emission areas spaced apart from each other, and
the protrusion is disposed in each of the emission areas.

17. A display device comprising:
a sub-electrode disposed on a substrate;
a protective layer disposed on the sub-electrode and an alignment electrode including a first electrode and a second electrode disposed on the protective layer;
a light emitting element disposed on the substrate; and
the light emitting element is aligned by providing an electrical signal to the sub-electrode;
the alignment electrode is provided with a signal, and
the sub-electrode includes a base part and a protrusion protruding from the base part.

\* \* \* \* \*